United States Patent
Hsu et al.

(10) Patent No.: US 10,204,852 B2
(45) Date of Patent: Feb. 12, 2019

(54) CIRCUIT SUBSTRATE AND SEMICONDUCTOR PACKAGE STRUCTURE

(71) Applicant: VIA Alliance Semiconductor Co., Ltd., Shanghai (CN)

(72) Inventors: Yeh-Chi Hsu, New Taipei (TW); Chen-Yueh Kung, New Taipei (TW)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/423,788

(22) Filed: Feb. 3, 2017

(65) Prior Publication Data

US 2017/0148720 A1    May 25, 2017

Related U.S. Application Data

(62) Division of application No. 14/828,758, filed on Aug. 18, 2015, now Pat. No. 9,601,425.

(30) Foreign Application Priority Data

Nov. 4, 2014 (TW) .............................. 103138138 A

(51) Int. Cl.
  *H05K 1/11* (2006.01)
  *H01L 23/498* (2006.01)
  (Continued)

(52) U.S. Cl.
  CPC ........ *H01L 23/49838* (2013.01); *H01L 23/13* (2013.01); *H01L 23/145* (2013.01);
  (Continued)

(58) Field of Classification Search
  CPC ... H05K 1/00; H05K 1/03; H05K 1/11; H05K 1/14; H05K 1/16; H05K 1/18; H05K 3/00; H05K 3/10; H05K 3/36; H05K 3/40; H05K 3/46; H01L 21/28; H01L 21/48; H01L 21/60; H01L 23/48; H01L 23/485; H01L 23/495; H01L 23/498
  USPC ......... 174/264, 250, 255, 260–262; 361/767, 361/803; 257/532, 673, 686, 693, 700, 257/723, 737, 778
  See application file for complete search history.

(56) References Cited

U.S. PATENT DOCUMENTS 5,172,473 A * 12/1992 Burns .................... H01L 23/32
                                                                29/885
5,474,458 A * 12/1995 Vafi .................. H01L 23/49827
                                                            257/E23.063

(Continued)

FOREIGN PATENT DOCUMENTS

| CN | 1645604 | 7/2005 |
|---|---|---|
| CN | 202917477 | 5/2013 |
| TW | M474262 | 3/2014 |

*Primary Examiner* — Xiaoliang Chen
(74) *Attorney, Agent, or Firm* — McClure, Qualey & Rodack, LLP

(57) ABSTRACT

A circuit substrate for a chip bonding thereon includes a core substrate having a chip-side surface and a bump-side surface opposite to the chip-side surface, a first through via plug passing through the core substrate, a pad disposed on the bump-side surface, in contact with the first through via plug, and a first thickness enhancing conductive pattern disposed on a surface of the pad, which is away from the bump-side surface.

9 Claims, 16 Drawing Sheets

(51) Int. Cl.
 *H01L 23/13* (2006.01)
 *H01L 23/14* (2006.01)
 *H01L 23/00* (2006.01)

(52) U.S. Cl.
 CPC .. *H01L 23/49811* (2013.01); *H01L 23/49827* (2013.01); *H01L 24/00* (2013.01); *H01L 2224/1308* (2013.01); *H01L 2224/81* (2013.01)

(56) References Cited

U.S. PATENT DOCUMENTS

| | | | |
|---|---|---|---|
| 5,607,488 A * | 3/1997 | Wiand | B24B 7/22 51/295 |
| 5,672,912 A * | 9/1997 | Aoki | H01L 21/563 257/693 |
| 5,736,790 A * | 4/1998 | Iyogi | H01L 24/10 257/780 |
| 5,929,521 A * | 7/1999 | Wark | G01R 1/06738 257/692 |
| 6,018,197 A * | 1/2000 | Saiki | H01L 23/49816 257/705 |
| 6,218,736 B1 * | 4/2001 | Yagi | H01L 21/4867 257/690 |
| 6,376,908 B1 | 4/2002 | Gaku et al. | |
| 6,396,143 B1 * | 5/2002 | Kimbara | H01L 21/4857 257/712 |
| 6,442,039 B1 * | 8/2002 | Schreiber | H01R 13/2435 361/760 |
| 6,952,049 B1 * | 10/2005 | Ogawa | H01G 4/232 257/678 |
| 7,122,901 B2 | 10/2006 | Sunohara et al. | |
| 8,710,657 B2 | 4/2014 | Park et al. | |
| 8,835,773 B2 | 9/2014 | Muramatsu et al. | |
| 8,945,329 B2 | 2/2015 | Yajima | |
| 2001/0004130 A1 * | 6/2001 | Higashi | H01L 23/5389 257/686 |
| 2003/0086248 A1 | 5/2003 | Mashino | |
| 2003/0136577 A1 | 7/2003 | Abe | |
| 2003/0215619 A1 | 11/2003 | Ooi et al. | |
| 2003/0230801 A1 * | 12/2003 | Jiang | H01L 23/13 257/723 |
| 2004/0034996 A1 * | 2/2004 | Akram | G01R 1/0408 29/832 |
| 2004/0084206 A1 * | 5/2004 | Tung | H01L 21/4853 174/255 |
| 2004/0089936 A1 * | 5/2004 | Shizuno | H01L 23/49816 257/686 |
| 2004/0154163 A1 * | 8/2004 | Miyazaki | H01L 23/3107 29/832 |
| 2004/0173891 A1 * | 9/2004 | Imai | H01L 23/49827 257/686 |
| 2004/0178508 A1 | 9/2004 | Nishimura et al. | |
| 2004/0197979 A1 * | 10/2004 | Jeong | B23K 3/0607 438/202 |
| 2004/0246690 A1 | 12/2004 | Nakamura et al. | |
| 2004/0256717 A1 * | 12/2004 | Suenaga | H01L 23/49822 257/700 |
| 2005/0012217 A1 | 1/2005 | Mori et al. | |
| 2005/0023033 A1 * | 2/2005 | Saiki | H01L 23/49827 174/260 |
| 2006/0051952 A1 | 3/2006 | Hsu et al. | |
| 2006/0125080 A1 * | 6/2006 | Hsu | H01L 23/5389 257/693 |
| 2006/0125094 A1 | 6/2006 | Lin | |
| 2006/0163740 A1 * | 7/2006 | Ohno | H01L 23/49816 257/762 |
| 2006/0170098 A1 | 8/2006 | Hsu | |
| 2006/0192282 A1 | 8/2006 | Suwa et al. | |
| 2006/0231290 A1 | 10/2006 | Kariya et al. | |
| 2006/0243478 A1 | 11/2006 | Inagaki et al. | |
| 2006/0261451 A1 * | 11/2006 | Nakatsu | H01L 23/49838 257/673 |
| 2007/0030628 A1 | 2/2007 | Yamamoto et al. | |
| 2007/0072405 A1 | 3/2007 | Kainou et al. | |
| 2007/0076392 A1 | 4/2007 | Urashima et al. | |
| 2007/0085203 A1 | 4/2007 | Kariya et al. | |
| 2007/0137887 A1 | 6/2007 | Watanabe et al. | |
| 2007/0200249 A1 * | 8/2007 | Tanida | H01L 23/49811 257/778 |
| 2007/0242440 A1 | 10/2007 | Sugaya et al. | |
| 2007/0263364 A1 | 11/2007 | Kawabe et al. | |
| 2007/0281394 A1 | 12/2007 | Kawabe et al. | |
| 2007/0298546 A1 * | 12/2007 | Lee | H01L 21/4853 438/124 |
| 2008/0011507 A1 | 1/2008 | Vasoya | |
| 2008/0149384 A1 | 6/2008 | Kawabe | |
| 2008/0258300 A1 * | 10/2008 | Kobayashi | H01L 21/4853 257/737 |
| 2008/0277150 A1 | 11/2008 | Takashima et al. | |
| 2008/0277776 A1 | 11/2008 | Enomoto | |
| 2008/0314618 A1 | 12/2008 | Shimoosako et al. | |
| 2009/0080168 A1 | 3/2009 | Sugino | |
| 2009/0107710 A1 * | 4/2009 | Goergen | H01P 3/081 174/258 |
| 2009/0145636 A1 * | 6/2009 | Miki | H01L 21/6835 174/255 |
| 2009/0145648 A1 * | 6/2009 | Horiuchi | B23K 1/0016 174/260 |
| 2009/0152742 A1 | 6/2009 | Ikeguchi et al. | |
| 2009/0196001 A1 | 8/2009 | Sunohara et al. | |
| 2009/0242261 A1 | 10/2009 | Takenaka et al. | |
| 2009/0273073 A1 | 11/2009 | Tachibana et al. | |
| 2009/0315190 A1 | 12/2009 | Kikuchi et al. | |
| 2010/0019382 A1 | 1/2010 | Miwa et al. | |
| 2010/0032196 A1 * | 2/2010 | Kaneko | H01L 21/4846 174/260 |
| 2010/0084163 A1 * | 4/2010 | Kodani | H01L 21/4846 174/250 |
| 2010/0117779 A1 | 5/2010 | Mano et al. | |
| 2010/0147574 A1 | 6/2010 | Kaneko et al. | |
| 2010/0163290 A1 | 7/2010 | Nagata | |
| 2010/0314254 A1 | 12/2010 | Kodani | |
| 2011/0095918 A1 | 4/2011 | Kim et al. | |
| 2011/0147951 A1 * | 6/2011 | Murayama | H01L 23/49827 257/778 |
| 2011/0304016 A1 * | 12/2011 | Nakamura | H01L 21/4857 257/532 |
| 2012/0067635 A1 * | 3/2012 | Nang | B23K 1/0016 174/260 |
| 2012/0152606 A1 * | 6/2012 | Kurokawa | H01L 23/49827 174/262 |
| 2012/0186863 A1 * | 7/2012 | Inoue | H01L 23/12 174/257 |
| 2012/0199967 A1 * | 8/2012 | Stacey | H01L 23/3114 257/737 |
| 2012/0211897 A1 * | 8/2012 | Hoshi | H01L 23/49822 257/774 |
| 2012/0327574 A1 | 12/2012 | Sakaguchi et al. | |
| 2013/0020711 A1 * | 1/2013 | Bao | H01L 24/05 257/773 |
| 2013/0098670 A1 * | 4/2013 | Inoue | H05K 3/4007 174/264 |
| 2013/0100624 A1 * | 4/2013 | Carpenter | H05K 1/114 361/783 |
| 2013/0100626 A1 * | 4/2013 | Inoue | H05K 1/118 361/783 |
| 2013/0161813 A1 * | 6/2013 | Miki | H01L 23/49811 257/737 |
| 2013/0180772 A1 * | 7/2013 | Inoue | H05K 1/111 174/263 |
| 2013/0277829 A1 | 10/2013 | Yee et al. | |
| 2014/0043783 A1 | 2/2014 | Ohira | |
| 2014/0055956 A1 | 2/2014 | Nakamura et al. | |
| 2014/0104802 A1 | 4/2014 | Oikawa | |
| 2014/0147970 A1 * | 5/2014 | Kim | H01L 25/50 438/107 |
| 2014/0360767 A1 | 12/2014 | Terui et al. | |
| 2014/0360768 A1 * | 12/2014 | Kang | H05K 3/4007 174/261 |

(56) References Cited

U.S. PATENT DOCUMENTS

| | | | |
|---|---|---|---|
| 2014/0363927 A1* | 12/2014 | Hurwitz | H05K 1/0298 |
| | | | 438/125 |
| 2015/0014020 A1* | 1/2015 | Kaneko | H05K 3/4007 |
| | | | 174/250 |
| 2015/0014027 A1* | 1/2015 | Kaneko | H05K 1/113 |
| | | | 174/255 |
| 2015/0062851 A1 | 3/2015 | Shimizu et al. | |
| 2015/0077963 A1* | 3/2015 | Adachi | H05K 1/144 |
| | | | 361/803 |
| 2015/0279799 A1* | 10/2015 | Thambidurai | H01L 21/78 |
| | | | 257/738 |
| 2015/0357277 A1* | 12/2015 | Nagai | H01L 23/49838 |
| | | | 174/255 |
| 2016/0064356 A1* | 3/2016 | Foong | H01L 25/0657 |
| | | | 361/767 |

* cited by examiner

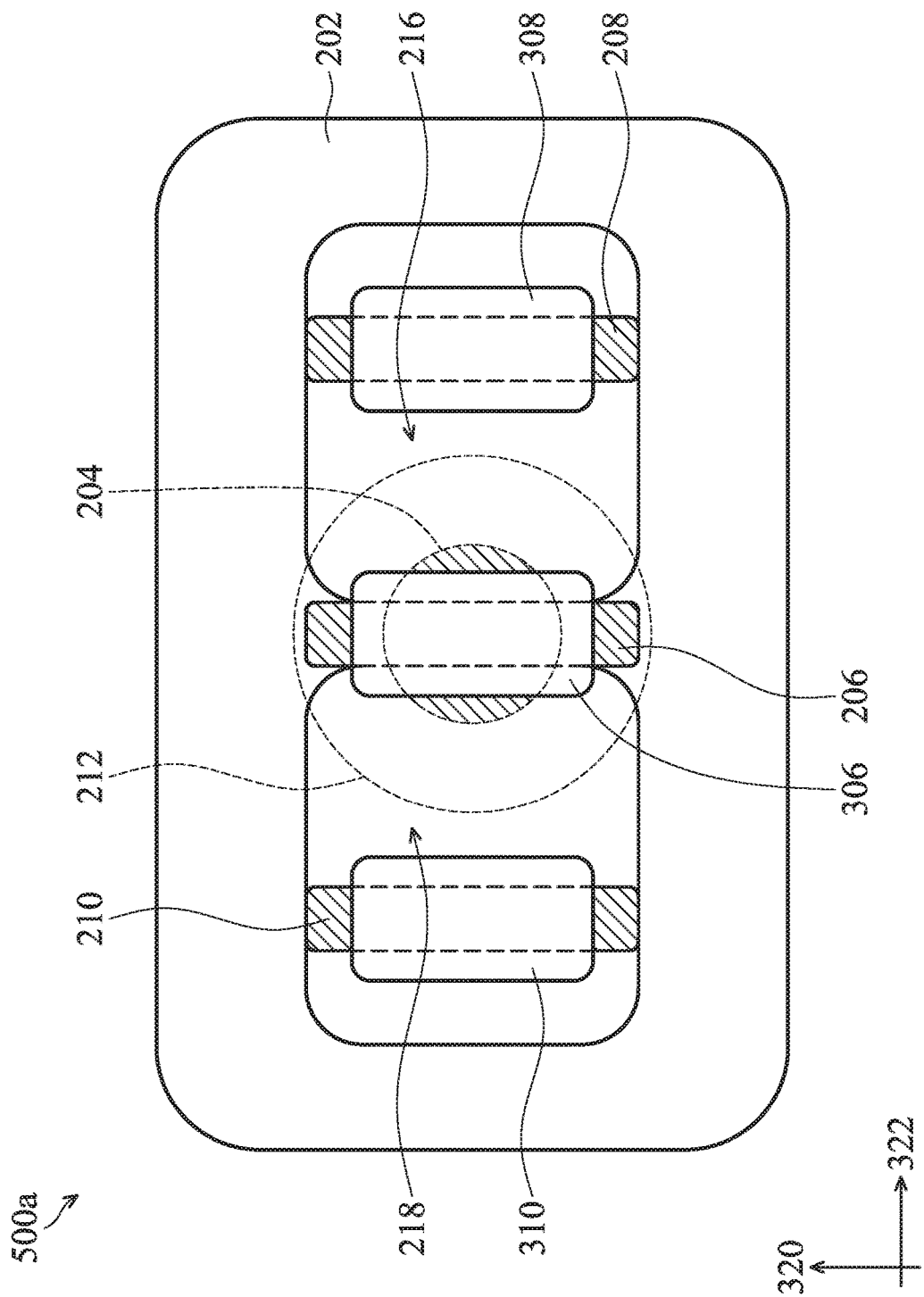

CIRCUIT SUBSTRATE AND SEMICONDUCTOR PACKAGE STRUCTURE

CROSS REFERENCE TO RELATED APPLICATIONS

This application is a Divisional of application Ser. No. 14/828,758, filed Aug. 18, 2015, now U.S. Pat. No. 9,601,425, which claims priority of Taiwan Patent Application No. 103138138, filed on Nov. 4, 2014, the entireties of which are incorporated by reference herein.

BACKGROUND OF THE INVENTION

Field of the Invention

The present invention relates to a circuit substrate and a semiconductor package structure, and in particular to a circuit substrate and a semiconductor package structure with a high routing density and a high bump density.

Description of the Related Art

In semiconductor package assembly technology, chip carriers are currently used to connect semiconductor integrated circuit (IC) chips to electronic devices in the lower layered-level, for example, circuit boards including motherboards or module boards. The circuit boards are usually used as the high pin-count chip carriers. The circuit boards are formed by alternately laminating a plurality of patterned conductive layers and a plurality of dielectric layers. Any two of the patterned conductive layers can be electrically connected to each other through conductive vias.

However, the routing density and the bump density of the circuit boards must be increased to meet the requirements of the integrated multi-chip packages and the multiple input/output (I/O) terminals chips.

Thus, a novel circuit substrate and a novel semiconductor package structure are desirable.

BRIEF SUMMARY OF THE INVENTION

Exemplary embodiments provide a circuit substrate and a semiconductor package structure. An exemplary embodiment of a circuit substrate for a chip bonding thereon includes a core substrate having a chip-side surface and a bump-side surface opposite to the chip-side surface, a first through via plug passing through the core substrate, a pad disposed on the bump-side surface, in contact with the first through via plug, and a first thickness enhancing conductive pattern disposed on a surface of the pad, which is away from the bump-side surface.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1A is a plan view of a circuit substrate in accordance with one embodiment of the disclosure;

DETAILED DESCRIPTION OF THE INVENTION

Figure 1B:
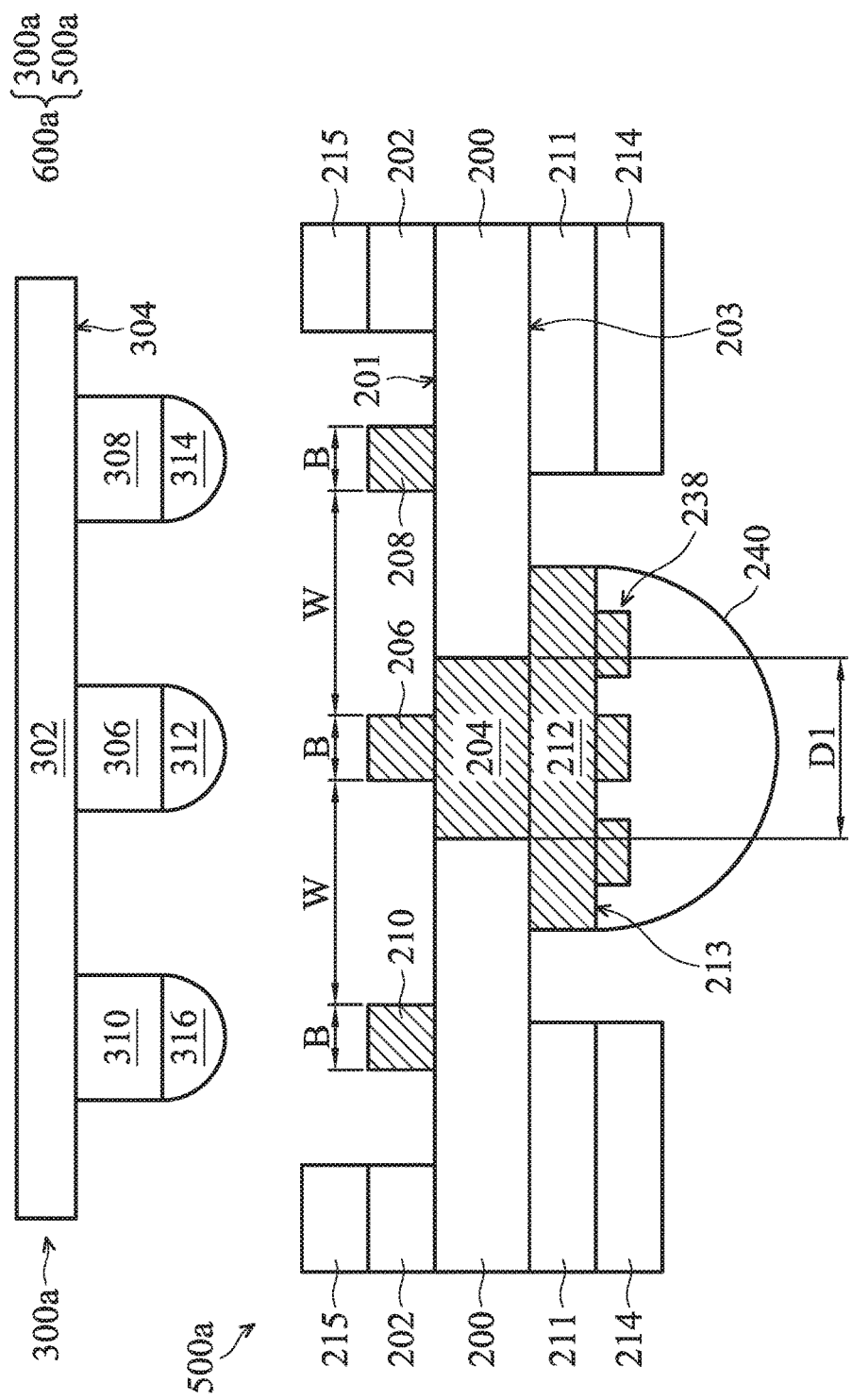
FIG. 1B is a cross-sectional view of a circuit substrate in accordance with one embodiment of the disclosure.

This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a circuit substrate. A chip is flipped and bonded on the circuit substrate using the bump-on-trace (BOT) technology. In the circuit substrate in accordance with some embodiments of the disclosure, one or more conductive line patterns are directly disposed on and directly connecting to a through via plug, which is used to transmit power/ground (GND) signals. The conductive line pattern and the through via plug are formed of the same materials, so that the routing density and the bump density are increased. Additionally, the conductive line patterns respectively disposed on adjacent through via plugs may be merged as a single conductive planar pattern with one or more thickness enhancing conductive patterns disposed thereon to increase the bonding strength. Also, one or more other thickness enhancing conductive patterns may be disposed on the pad, which connects to the through via plug, to increase the bonding strength between the pad and the bump.

Figure 1C:
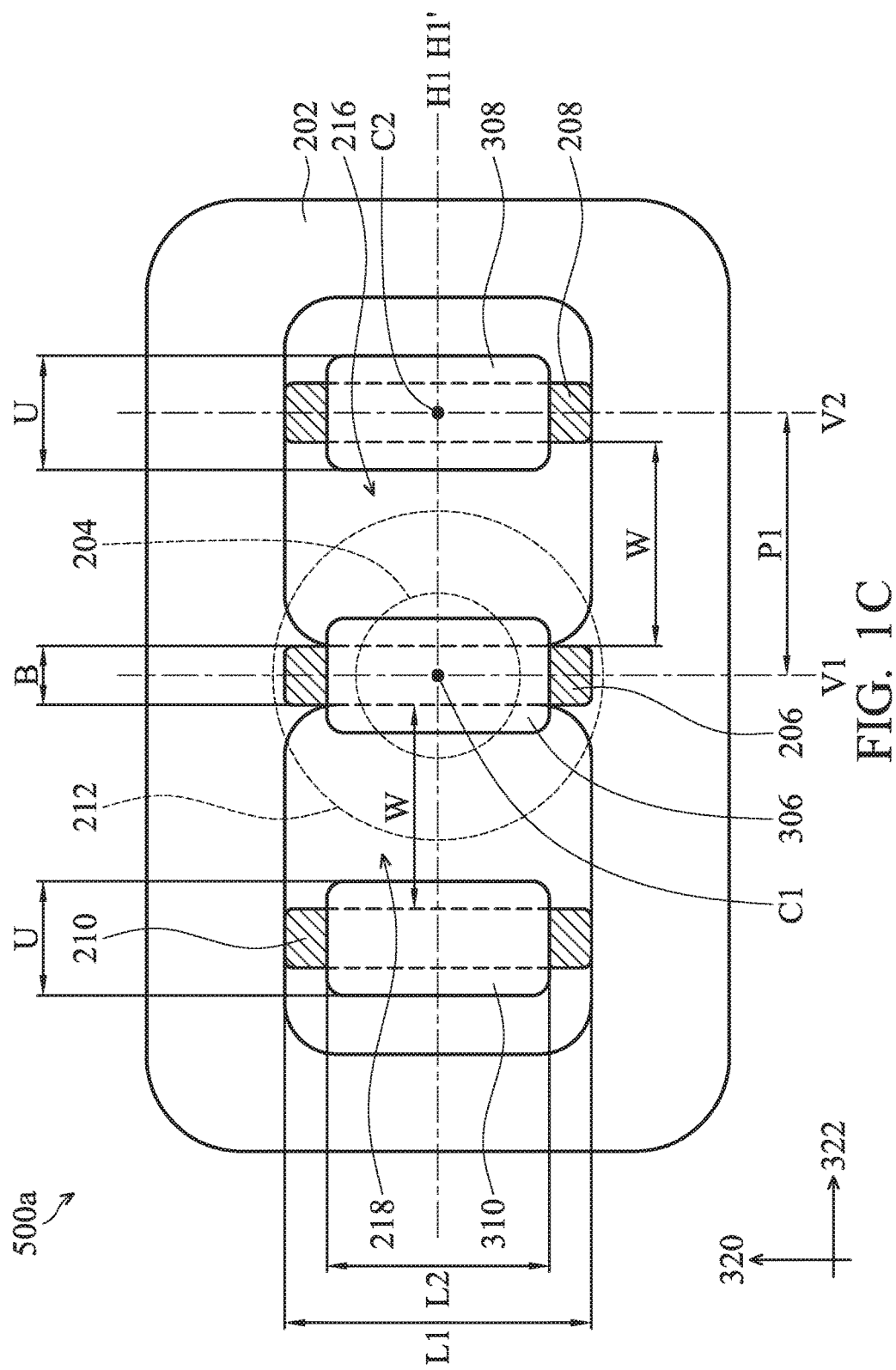
FIG. 1C is a schematic view showing the diameters of the elements of a circuit substrate in accordance with one embodiment of the disclosure.

FIG. 1A is a plan view of a circuit substrate 500a of a semiconductor package 600a in accordance with one embodiment of the disclosure. FIG. 1B is a cross-sectional view of FIG. 1A. FIG. 1C is a schematic view showing the diameters of the elements of the circuit substrate 500a in accordance with one embodiment of the disclosure. FIGS. 1A and 1C show conductive pillars of chips but do not show the substrate and solder bumps for conveniently illustrating the arrangement of the circuit substrate.

As shown in FIGS. 1A-1C, the circuit substrate 500a in accordance with one embodiment of the disclosure comprises a core substrate 200, a through via plug 204, conductive line patterns 206, 208 and 210, and a pad 212. The core substrate 200 has a chip-side surface 201 and a bump-side surface 203 opposite to the chip-side surface 201. In one embodiment, the core substrate 200 may be formed of paper phenolic resin, composite epoxy, polyimide resin or composite materials, which include BT (Bismaleimide-Triazine) resin or reinforced resins including glass fibers. In one embodiment, the bump-side surface 203 may serve as a ball-side surface.

The through via plug 204 is formed through the core substrate 200, and two terminals of the through via plug 204 are aligned the chip-side surface 201 and the bump-side surface 203 of the core substrate 200. Additionally, the through via plug 204 is arranged between the adjacent conductive line patterns 208 and 210. In this embodiment, the through via plug 204 is arranged corresponding to the pad 212. In other words, the conductive line pattern 206, the through via plug 204 and the pad 212 overlap one another in a top view (FIG. 1A). The pad 212 connects with the electronic devices, which is positioned in the lower layered-level, by the solder bumps or solder balls (not shown). In one embodiment, the through via plug 204 is used to transmit power voltage supply and ground (GND) voltage supply, but not to transmit digital signals. The through via plug 204 may be formed of conductive metals including copper or copper alloy. The through via plug 204 may be formed by the laser drilling process and the electronic plating process.

The conductive line patterns 206, 208 and 210 separated from one another are disposed on the chip-side surface 201 of the core substrate 200, respectively. The pad 212 is disposed on the bump-side surface 203 of the core substrate 200. In one embodiment, the conductive line patterns 206, 208 and 210 are specially indicated as bonding segments of the conductive lines. The bonding segments are merely small line segments of the conductive lines, respectively. The thickness of the bonding segments is the same as that of the conductive lines used to form the bonding segments. In one embodiment, the conductive line patterns 206, 208 and 210 and the pad 212 may be formed of conductive metals including copper or copper alloy. A conductive layer is entirely formed on the chip-side surface 201 and the bump-side surface 203 of the core substrate 200 by performing the electronic plating process, the laminating process and the coating process. Next, the image transfer process, which includes the photoresist coating, developing, etching and stripping processes, is performed to form the conductive line patterns 206, 208 and 210 on the chip-side surface 201, and the pad 212 on the bump-side surface 203. Also, conductive planar layers 202 and 211, for example, copper layers, are respectively formed on the chip-side surface 201 and the bump-side surface 203 of the core substrate 200 during forming the conductive line patterns 206, 208 and 210 and the pad 212. Therefore, the conductive line patterns 206, 208 and 210 and the conductive planar layer 202 belong to the same layered-level. The pad 212 and the conductive planar layer 211 belong to the same layered-level. In one embodiment, the conductive line pattern 206 may be electrically connected to the conductive line pattern 208 and/or the conductive line pattern 210 through the conductive planar layer 202. In this embodiment, the conductive line patterns 206, 208 and 210 may be used to transmit the same voltage supply, such as power voltage supply or ground (GND) voltage supply, but not to transmit digital signals. As shown in FIG. 1A, the conductive line patterns 206, 208 and 210 and the conductive planar layer 202, which surrounds the conductive line patterns 206 and 210 and connects to the conductive line pattern 208, collectively from vent holes 216 and 218 on the chip-side surface 201 of the core substrate 200. Different portions of the through via plug 204 are exposed at the vent holes 216 and 218, respectively. In one embodiment as shown in FIG. 1C, the shape of the vent holes 216 and 218 may include a rectangular shape, a polygonal shape or an elliptical shape. Therefore, FIG. 1B may serve as a cross-sectional view of FIG. 1A along the width direction (the second direction 322) of the conductive line patterns 206, 208 and 210 of the circuit substrate 500a.

As shown in FIGS. 1A-1C, the conductive line pattern 206 is designed to be a BOT conductive line pattern which directly connects to the through via plug 204. In the drawings, it should be noted that the second direction 322 is defined as a direction substantially parallel to the width direction of the BOT conductive line pattern (i.e. the conductive line pattern 206), which directly connects to the through via plug. The first direction 320 is defined as a direction substantially parallel to the length direction of the conductive line pattern 206. As shown in FIG. 1C, the width of the vent holes 216 and 218 along the second direction 322 is defined as W, and the length of the vent holes 216 and 218 along the first direction 320 is defined as L1, according to the definition of the second direction 322 and the first direction 320. Therefore, the through via plug 204 is in direct contact with the conductive line pattern 206, and partially overlapping the conductive line pattern 206. Also, the through via plug 204 is not in direct contact with the conductive line patterns 208 and 210. The conductive line patterns 206, 208 and 210 may be designed to have the same width B (the minimum width of the conductive line defined by the design rule). The width B is less than or equal to the diameter D1 of the through via plug 204. Additionally, the width B of the conductive line patterns 206, 208 and 210 are less than or equal to the width W of the vent holes 216 and 218 along the second direction 322 (FIG. 1C).

In one embodiment, because the conductive line pattern 206 disposed on the chip-side surface 201 of the core substrate 200 is in direct contact with the through via plug 204, the density of the bonding segments is increased. The number of conductive layers on the chip-side surface 201 and the bump-side surface 203 of the core substrate 200 can be just one. Therefore, the circuit substrate 500a can be a two-layer circuit board. In other embodiments, the number of conductive layers on the chip-side surface 201 is different from that on the bump-side surface 203 of the core substrate 200. Therefore, the circuit substrate 500a can be a single-side build-up circuit substrate.

The semiconductor package 600a further comprises solder mask layers 215 and 214 on the chip-side surface 201 and the bump-side surface 203 of the core substrate 200, respectively. The solder mask layer 215 having one or more openings covers a portion of the conductive planar layer 202. Portions of the conductive line patterns 206, 208 and 210 are exposed at the openings of the solder mask layer 215. Also, the openings are separated from the conductive line patterns 206, 208 and 210 by a distance. The solder mask layer 215 may prevent the underlying conductive planar layer 202 from oxidation. The solder mask layer 214 may have one or more openings to expose the pad 212. Also, the openings of the solder mask layer 214 are separated from the pad 212 by a distance. The openings are separated from separated from the pad 212 to prevent solder bumps 240 disposed on the pad 212 from short-circuiting with other conductive lines and solder bumps. Also, the openings of the solder mask layer 214 may provide positions of the subsequent conductive bumps. In one embodiment, the solder mask layers 214 and 215 may comprise solder-resistant materials including solder mask, or insulating materials including polyimide, ajinomoto build-up film, epoxy, polymethylmethacrylate (PMMA) resin, a composite including epoxy and PMMA resin, or polypropylene (PP). The solder mask layers 214 and 215 may be formed by a coating, a printing process, an adhesion process, a laminating process or other proper processes. The semiconductor package 600a further comprises a solder bump 240 disposed on the pad 212. In one embodiment, the solder bump 240 may be formed of materials including a solder paste. The solder bump 240 may be formed on the pad 212 by a deposition process and a patterning process, or printing process/ball attachment process.

FIGS. 1A-1C illustrate the relationship between a chip 300a and the circuit substrate 500a bonded thereto. As shown in FIG. 1B, the chip 300a includes a substrate 302 (for example, a silicon substrate), conductive pillars 306, 308 and 310, and solder bumps 312, 314 and 316. The chip 300a is flipped up-side-down by the flip-chip process, so that the conductive pillars 306, 308 and 310 on a top surface 304 of the substrate 302 are electrically connected to the conductive line patterns 206, 208 and 210, respectively. The conductive pillar 306 may be electrically connected to the through via plug 204 and the pad 212 by the conductive line pattern 206. That is to say, the conductive line pattern 206 partially overlaps the through via plug 204, the pad 212 and conductive pillar 306 (FIGS. 1A-1C). In one embodiment, the conductive pillars 306, 308 and 310 have a width U along the second direction 322 and a length L2 along the first direction 320. The width U is not smaller than the width B of the conductive line patterns; the length L2 of the conductive pillars is not larger than the length L1 of the conductive line patterns. The conductive pillars 306, 308 and 310 may be formed of copper. In one embodiment, the materials and the formation of the solder bumps 312, 314 and 316 may be the same as or similar to those of the solder bump 240. It should be noted that because the conductive line pattern 206 is designed not to be disposed on the through via plug 204 in the conventional technology, the chip 300a is designed without including the arrangement of the conductive pillar 306 and the solder bump 312. On the contrary, the circuit substrate 500a is designed to dispose the conductive line pattern 206 on the through via plug 204, and thus the density of the conductive pillars disposed on the chip 300a is increased.

FIG. 1C illustrates the relationship between the diameters of the elements (for example, the conductive line patterns 206, 208 and 210 and the vent holes 216 and 218) of a circuit substrate 500a and the diameters of the conductive pillars 306, 308 and 310 of the chip 300a in the semiconductor package 600a in accordance with one embodiment of the disclosure. In one embodiment, the conductive line pattern 206, which is directly disposed on the through via plug 204, and the conductive line pattern 208 (or 210) adjacent thereto are extended substantially along the first direction 320, and separated from each other substantially along the second direction 322 perpendicular to the first direction 320. The relationship between the width of the conductive line pattern 206, which is directly disposed on the through via plug 204, and the width of the conductive line pattern 208 (or 210) satisfies Equation (1):

$$B \leq D1, \text{ and } B \leq W \quad \text{Equation (1)}$$

wherein B is the width of the conductive line pattern 206 and the conductive line pattern 208 (or 210) along the second direction 322, D1 is the diameter of the through via plug 204, and W is the width of the vent holes 216 (or 218) along the second direction 322.

In other embodiments, if the position of the conductive line pattern 208 (or 210) is shifted, for example, if an extension line H1' passing through the centers of the conductive line pattern 206 and the conductive line pattern 208 (or 210) is not parallel to the second direction 322, the angle θ between the first extension line H1 along the second direction 322 and passing through the first center point C1 of the conductive line pattern 206, and a second extension line H1' passing through the first center point C1 and the second center point C2 of the conductive line pattern 208 (or 210), satisfy the Equation (2):

$$0° \leq \theta \leq 45° \quad \text{Equation (2)}$$

In one embodiment as shown in FIG. 1C, because the first extension line H1 overlaps the second extension line H1', the angle θ is equal to zero degrees.

In one embodiment, the minimum pitch P1 between the first center point C1 of the conductive line pattern 206 and the second center point C2 of the conductive line pattern 208 (or 210) along the second direction 322 satisfies Equation (3):

$$P1 = (B+U)\sec\theta, \text{ and } \theta = 0° \quad \text{Equation (3)}$$

wherein B is the width of the conductive line pattern 206 and the width of the conductive line pattern 208 (or 210) along the second direction 322, and U is the width of the conductive pillars 306, 308 and 310 along the second direction 322.

Additionally, in one embodiment, an angle λ between a first extension line V1 along the first direction 320 and passing through the first center point C1 of the conductive line pattern 206, which is directly disposed on the through via plug 204, and a second extension line V2 passing through the second center point C2 of the adjacent conductive line pattern 208 (or 210) satisfies Equation (4):

$$0° \leq \lambda \leq 90° \quad \text{Equation (4)}$$

In one embodiment as shown in FIG. 1C, because the first extension line V1 is substantially parallel to the second extension line V2, the angle λ is equal to zero degrees.

Figure 2A:
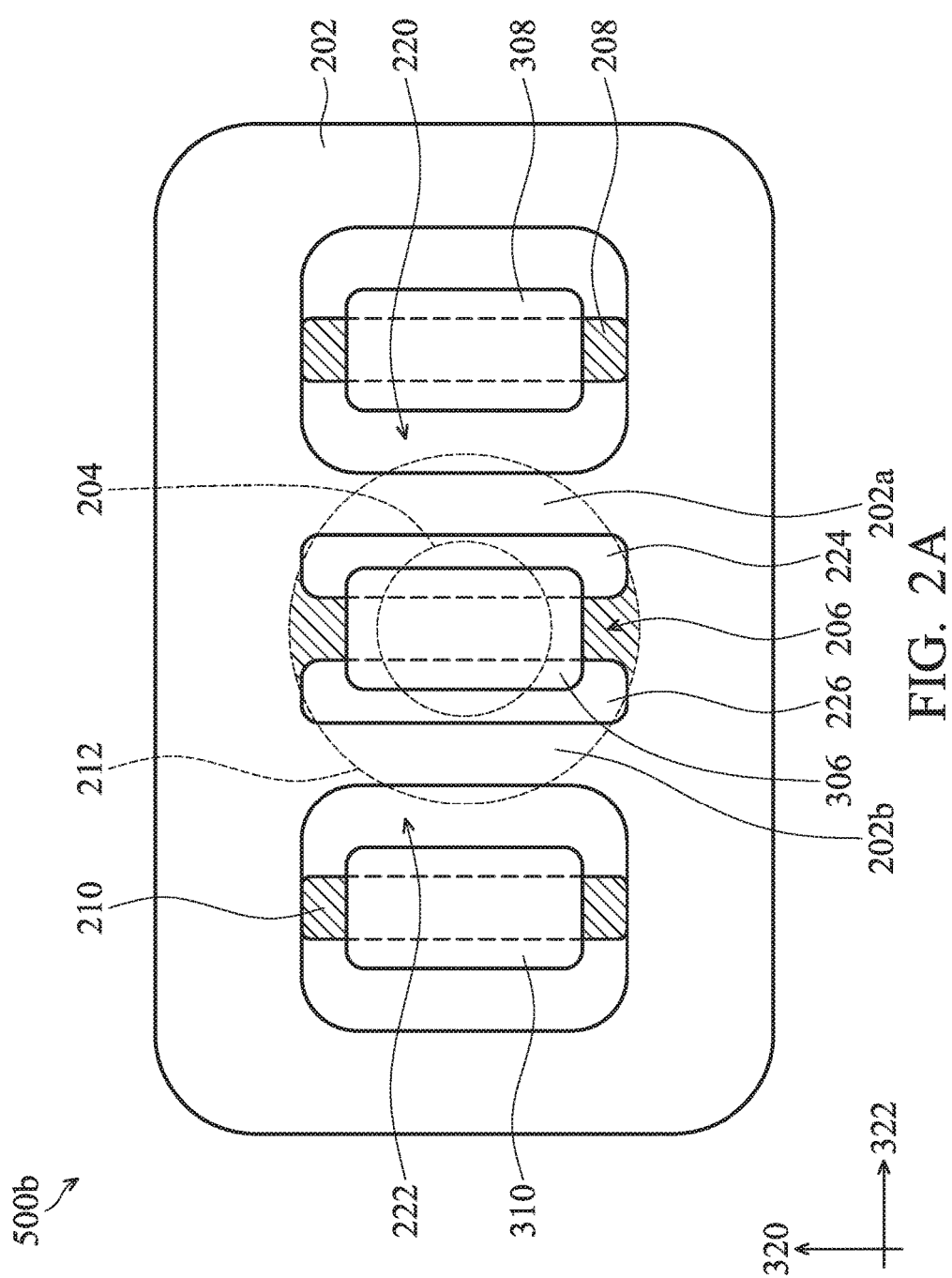
FIG. 2A is a plan view of a circuit substrate in accordance with another embodiment of the disclosure.
Figure 2B:
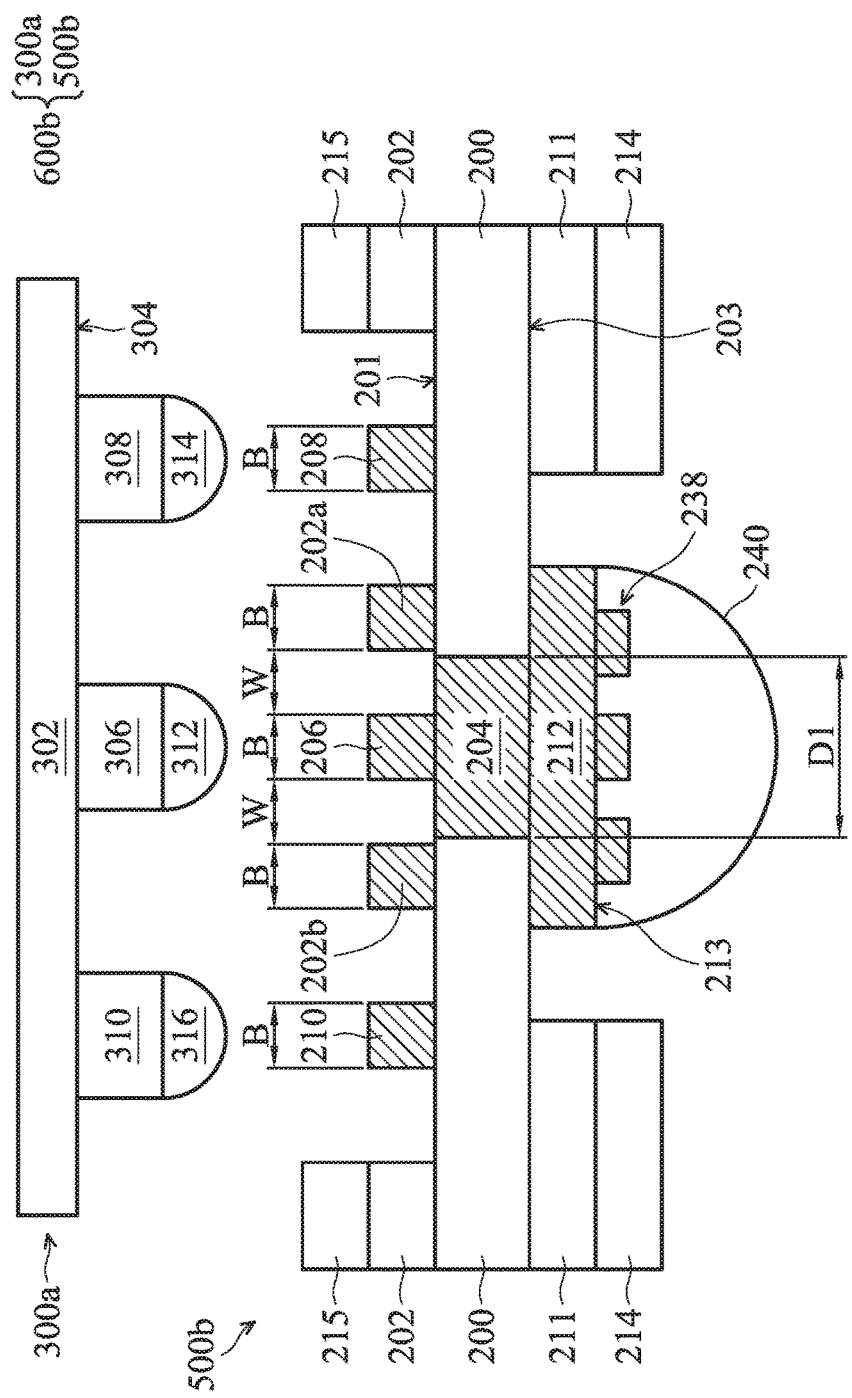
FIG. 2B is a cross-sectional view of a circuit substrate in accordance with another embodiment of the disclosure.
Figure 2C:
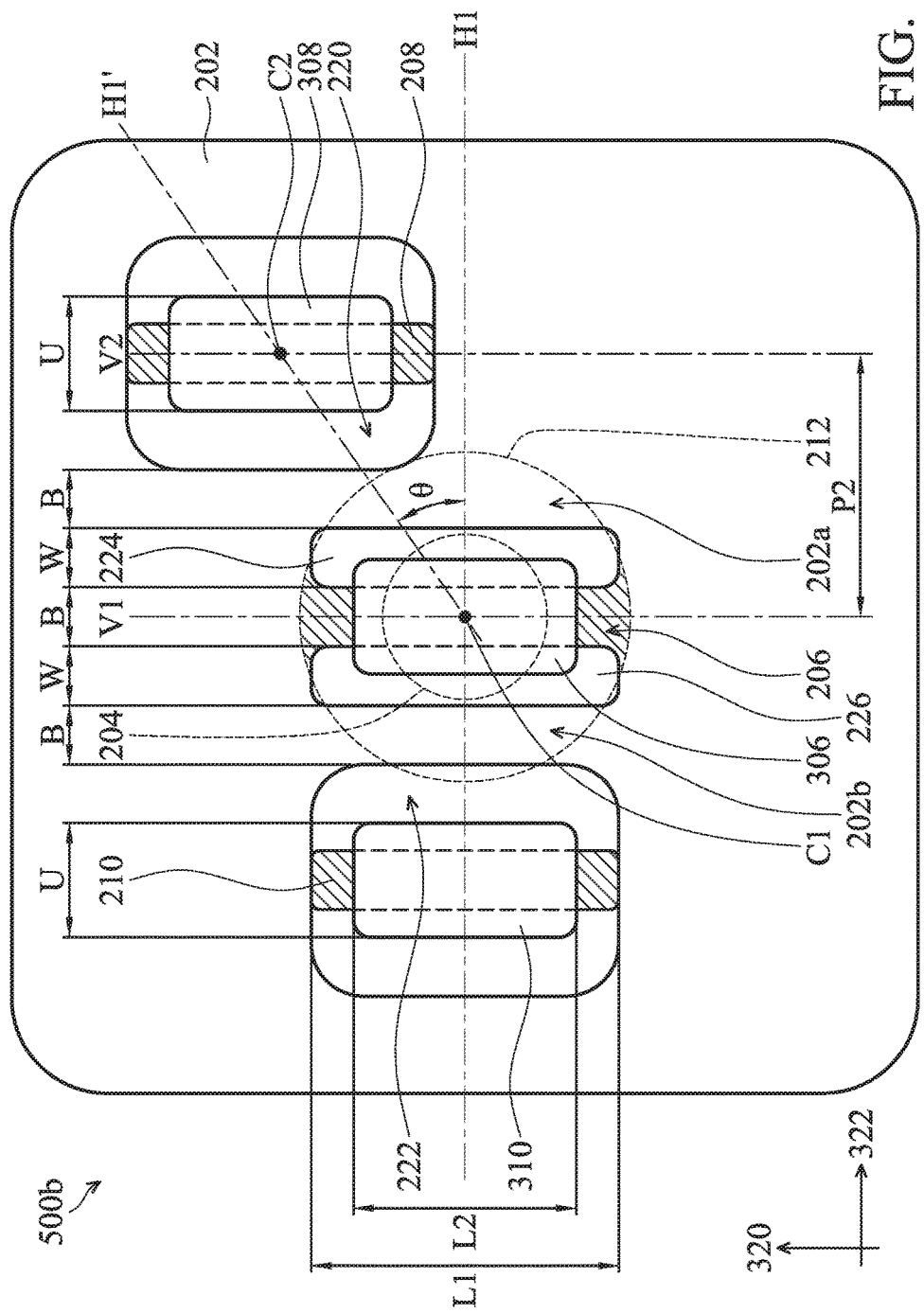
FIGS. 2C and 2D are schematic views showing the diameters of the elements of a circuit substrate in accordance with another embodiment of the disclosure.
Figure 2D:
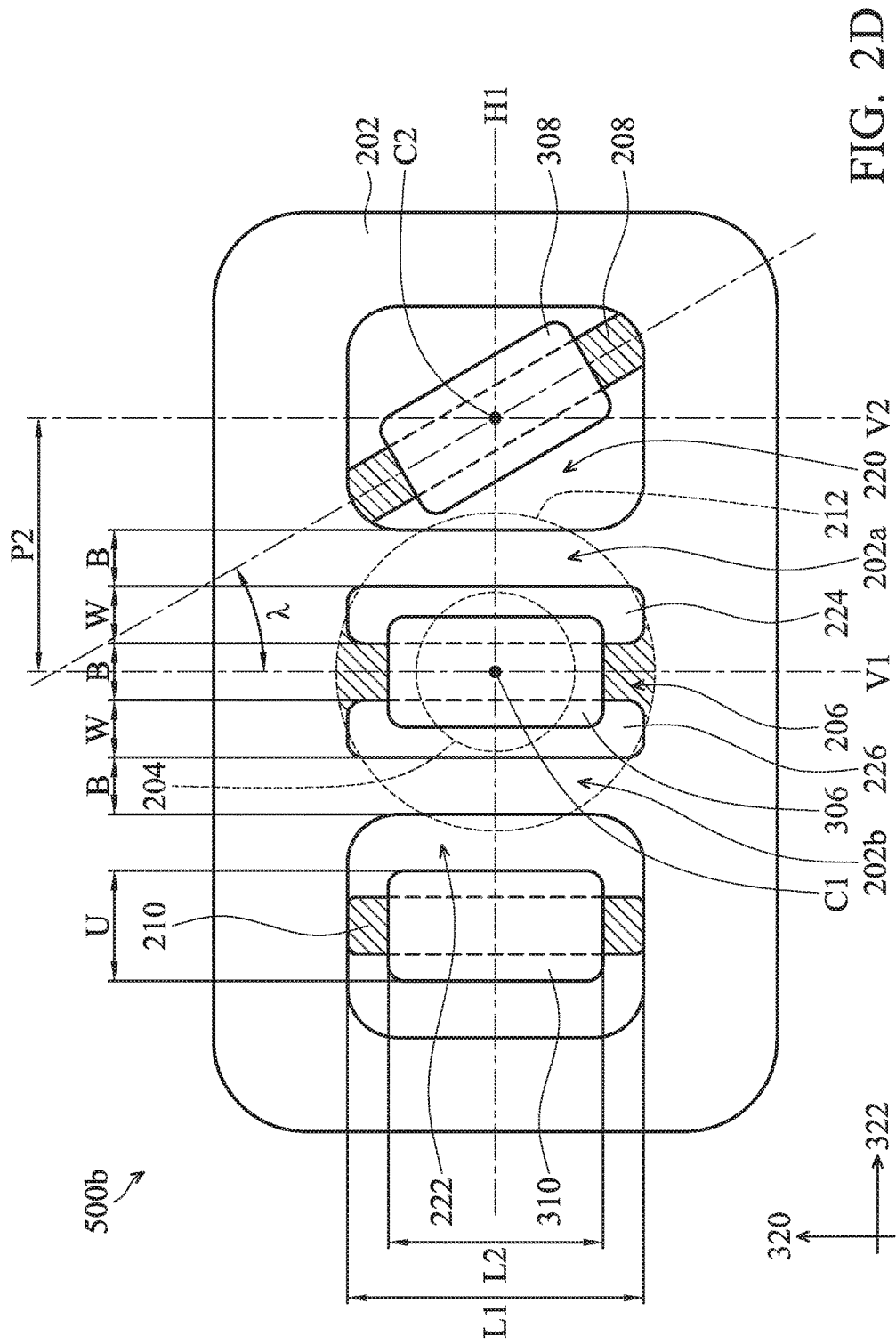

FIG. 2A is a plan view of a circuit substrate 500b of a semiconductor package 600b in accordance with one embodiment of the disclosure. FIG. 2B is a cross-sectional view of FIG. 2A. FIG. 2B may serve as a cross-sectional view along the width direction (the second direction 322) of the BOT conductive line pattern (for example, the conductive line pattern 206), which directly connects to the through via plug, of the circuit substrate 500b. FIGS. 2C and 2D are schematic views showing the diameters of the elements of the circuit substrate 500b and conductive pillars of a chip in accordance with one embodiment of the disclosure. FIGS. 2A, 2C and 2D show the conductive pillars of the chip but do not show the substrate and solder bumps for conveniently illustrating the arrangement of the circuit substrate 500b. Elements of the embodiments hereinafter, that are the same or similar as those previously described with reference to FIGS. 1A-1C, are not repeated for brevity.

In one embodiment, the conductive planar layer 202 may have segments 202a and 202b. The segment 202a is disposed between the conductive line pattern 206, which is directly disposed on the through via plug 204, and the adjacent conductive line pattern 208. The segment 202a is substantially parallel to the conductive line pattern 206. The segment 202b is disposed between the conductive line pattern 206, which is directly disposed on the through via plug 204, and the adjacent conductive line pattern 210. The segment 202b is substantially parallel to the conductive line pattern 206. The conductive planar layer 202, the segment 202a and the conductive line pattern 208 collectively form a vent hole 220 on the chip-side surface 201. The conductive planar layer 202, the segment 202a and the conductive line pattern 206 collectively form a vent hole 224 on the chip-side surface 201. The conductive planar layer 202, the segment 202b and the conductive line pattern 210 collectively form a vent hole 222 on the chip-side surface 201. The conductive planar layer 202, the segment 202b and the conductive line pattern 206 collectively form a vent hole 226 on the chip-side surface 201. Portions of the through via plug 204 are exposed at the vent holes 224 and 226, which are adjacent to the conductive line pattern 206, respectively. In one embodiment, the shape of the vent holes 220, 222, 224 and 226 may include a rectangular shape, a polygonal shape or an elliptical shape. In one embodiment, the conductive line patterns 206, 208 and 210 may be designed to have the same width B (it can be the minimum width of the conductive line of the design rule). Additionally, the segments 202a and 202b and the conductive line pattern 206 may be designed to have the same width B. The vent holes 224 and 226 may be designed to have the same width W. In one embodiment, the width B of the conductive line pattern 206 is less than or equal to the diameter D1 of the through via plug 204. Also, the width B of the conductive line pattern 206 is less than or equal to the width W of the vent holes 224 and 226.

FIGS. 2C and 2D illustrate the relationship between the diameters of the elements (for example, the conductive line patterns 206, 208 and 210, the segments 202a and 202b, the vent holes 220, 222, 224 and 226) of a circuit substrate 500b and the diameters of the conductive pillars 306, 308 and 310 of the chip 300a in the semiconductor package 600a in accordance with another embodiment of the disclosure. In one embodiment, the conductive line pattern 206, which is directly disposed on the through via plug 204, and the conductive line pattern 208 (or 210) adjacent thereto are extended substantially along the first direction 320, and separated from each other substantially along the second direction 322 perpendicular to the first direction 320. The relationship between the width of the conductive line pattern 206, which is directly disposed on the through via plug 204, and the width of the conductive line pattern 208 (or 210) satisfies Equation (5):

$$B \leq D1, \text{ and } B \leq W \qquad \text{Equation (5)}$$

wherein B is the width of the conductive line pattern 206 and the conductive line pattern 208 (or 210) along the second direction 322, D1 is the diameter of the through via plug 204, and W is the width of the vent holes 224 and 226 adjacent to the conductive line pattern 206 along the second direction 322.

In other embodiments, if the position of the conductive line pattern 208 (or 210) is shifted, for example, if an extension line H1' passing through centers of the conductive line pattern 206 and the conductive line pattern 208 (or 210) is not parallel to the second direction 322, the angle θ between the first extension line H1 the second direction 322 and passing through the first center point C1 of the conductive line pattern 206 and a second extension line H1' passing through the first center point C1 and the second center point C2 of the conductive line pattern 208 (or 210) satisfy the Equation (6):

$$0° \leq \theta \leq 45° \qquad \text{Equation (6)}$$

In one embodiment as shown in FIG. 2C, because the position of the conductive line pattern 208 adjacent to the conductive line pattern 206 is shifted, the first extension line H1 does not overlap the second extension line H1', the angle θ is not equal to zero degrees. In one embodiment as shown in FIG. 2D, because the first extension line H1 overlaps the second extension line H1' (the position of the second extension line H1' is the same as the position of the first extension line H1), the angle θ is equal to zero degrees.

Also, the minimum pitch P2 between the first center point C1 of the conductive line pattern 206 and the second center point C2 of the conductive line pattern 208 (or 210) along the second direction 322 satisfies Equation (7):

$$P2=(3B+U)\sec \theta, \text{ and } \theta=0° \qquad \text{Equation (7)}$$

wherein B is the width of the conductive line pattern 206, the width of the conductive line pattern 208 (or 210) and the width of the segments 202a and 202b along the second direction 322, and U is the width of the conductive pillars 306, 308 and 310 along the second direction 322.

Additionally, in one embodiment, an angle λ between a first extension line V1 passing through the first center point C1 of the conductive line pattern 206, which is directly disposed on the through via plug 204, along the first direction 320 and a second extension line V2 passing through the second center point C2 of the conductive line pattern 208 (or 210) satisfies Equation (8):

$$0° \leq \lambda \leq 90° \qquad \text{Equation (8)}$$

In one embodiment as shown in FIG. 2C, because the first extension line V1 is substantially parallel to the second extension line V2, the angle λ is equal to zero degrees. In one embodiment as shown in FIG. 2D, because the conductive line pattern 206 is not parallel to the conductive line pattern 208, the first extension line V1 and the second extension line V2 intersect, and the angle λ satisfies Equation (8).

Figure 3A:
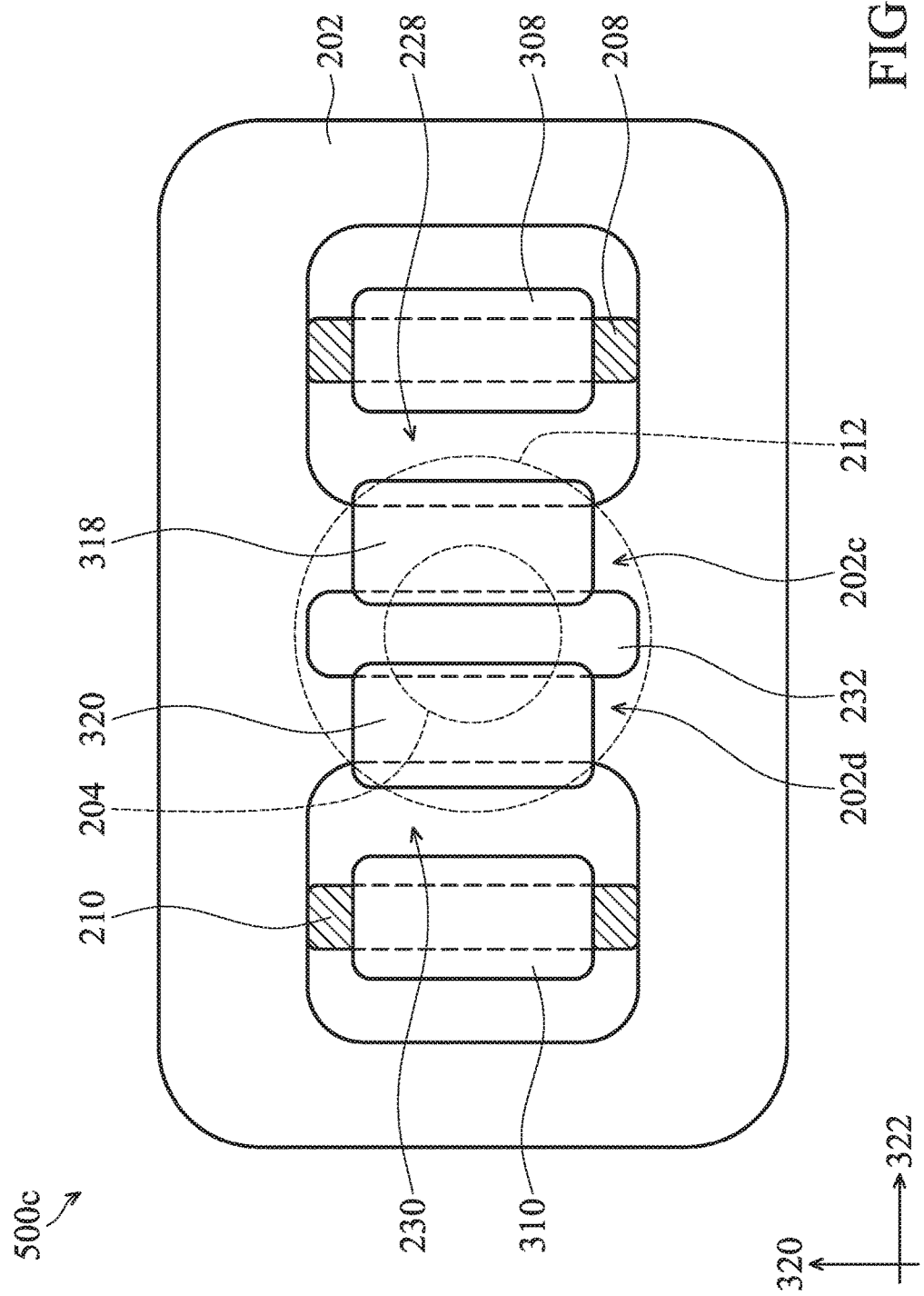
FIG. 3A is a plan view of a circuit substrate in accordance with yet another embodiment of the disclosure.
Figure 3B:
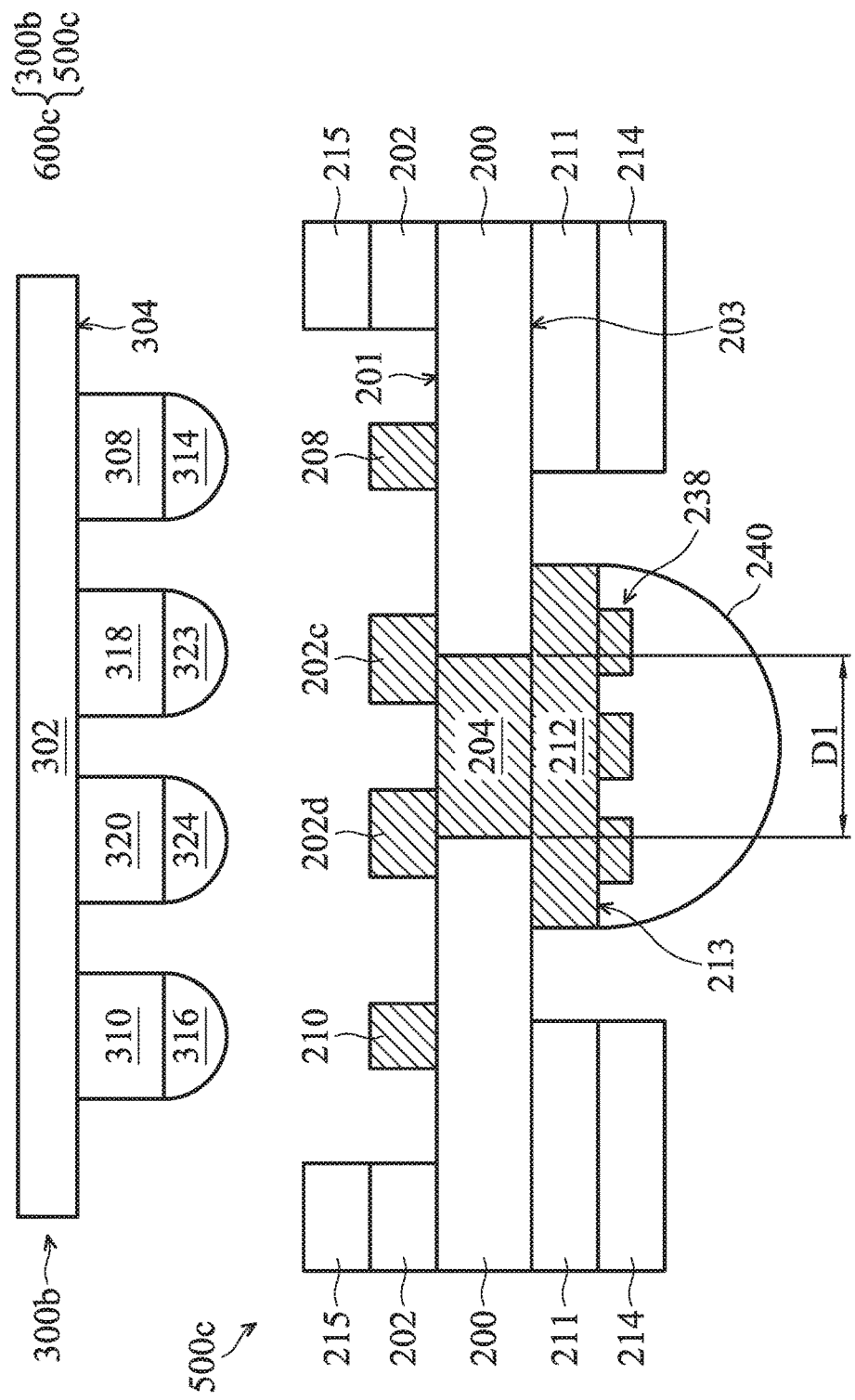
FIG. 3B is a cross-sectional view of a circuit substrate in accordance with yet another embodiment of the disclosure.
Figure 3C:
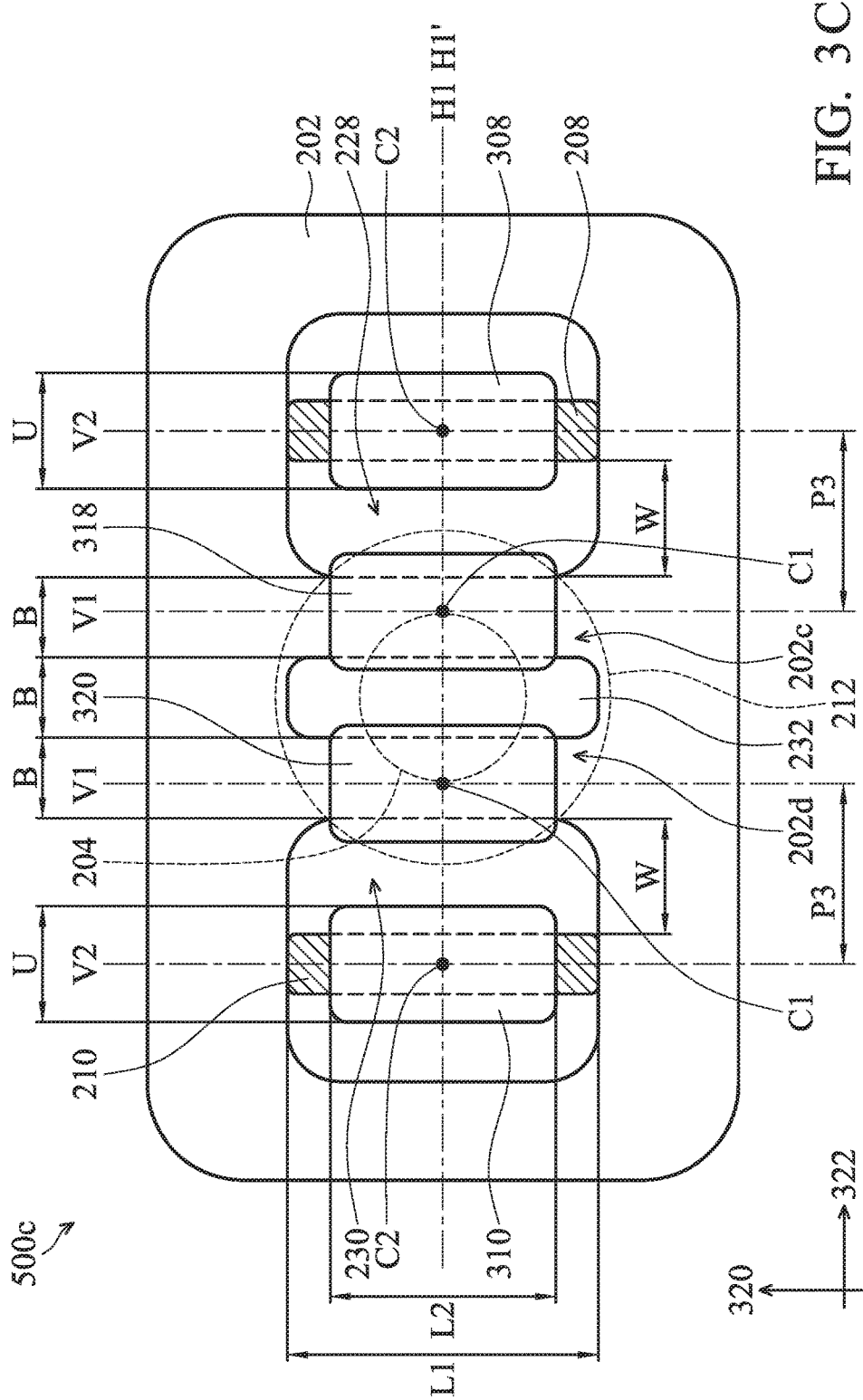
FIG. 3C is a schematic view showing the diameters of the elements of a circuit substrate in accordance with yet another embodiment of the disclosure.

FIG. 3A is a plan view of a circuit substrate 500c of a semiconductor package 600c in accordance with one embodiment of the disclosure. FIG. 3B is a cross-sectional view of FIG. 3A. FIG. 3B may serve as a cross-sectional view along the direction of the width of the conductive line pattern (the second direction 322). FIG. 3C is a schematic view showing the diameters of the elements of the circuit substrate 500c and conductive pillars of a chip in accordance with one embodiment of the disclosure. FIGS. 3A and 3C show the conductive pillars of the chip but do not show the substrate and solder bumps for conveniently illustrating the arrangement of the circuit substrate. Elements of the embodiments hereinafter, that are the same or similar as those previously described with reference to FIGS. 1A-1C and 2A-2D, are not repeated for brevity.

In one embodiment, the conductive planar layer 202 may have segments 202c and 202d. The segments 202c and 202d are disposed between the conductive line patterns 208 and 210 and substantially parallel to the conductive line patterns 208 and 210. The conductive planar layer 202 and the segments 202c and 202d collectively form a vent hole 232 on the chip-side surface 201. The conductive planar layer 202, the segment 202c and the conductive line pattern 208 adjacent thereto collectively form a vent hole 228 on the chip-side surface 201. The conductive planar layer 202, the segment 202d and the conductive line pattern 210 adjacent thereto collectively form a vent hole 230 on the chip-side surface 201. Portions of the through via plug 204 are exposed at the vent hole 232 between the segments 202c and 202d. In one embodiment, the shape of the vent holes 228, 230 and 232 may include a rectangular shape, a polygonal shape or an elliptical shape.

In one embodiment, the segments 202c and 202d of the conductive planar layer 202 are designed to be BOT conductive line patterns directly connected to the through via plug. Therefore, the through via plug 204 is in direct contact with the segments 202c and 202d. The through via plug 204 partially overlaps the segments 202c and 202d. Also, the through via plug 204 is not in contact with the conductive line patterns 208 and 210. Additionally, the segments 202c and 202d and the conductive line patterns 208 and 210 may be designed to have the same width B (it can be the minimum width of the conductive line of the design rule). The vent hole 232 between the segments 202c and 202d may be designed to have a width the same as the width B. The width B is less than or equal to the diameter D1 of the through via plug 204. Further, the width B of the segments 202c and 202d and the conductive line patterns 208 and 210 is less than or equal to the width W of the vent holes 228 and 230 (FIG. 3C).

FIGS. 3A-3C illustrate the relationship between a chip 300b and the circuit substrate 500c bonded thereto. As shown in FIG. 3B, the chip 300b includes a substrate 302, conductive pillars 308, 310, 318 and 320, and solder bumps 314, 316, 323 and 324. The conductive pillars 308, 310, 318 and 320 are electrically connected to the substrate 302. Also, the conductive pillars 308, 310, 318 and 320 are electrically connected to the conductive line pattern 208, the conductive line pattern 210, the segment 202c and the segment 202d through the solder bumps 314, 316, 323 and 324, respectively. Therefore, the conductive pillars 318 and 320 may be electrically connected to the through via plug 204 and the pad 212 through the segments 202c and 202d. That is to say, the segments 202c and 202d partially overlap the through via plug 204, the pad 212, respectively. The segments 202c and 202d partially overlap the conductive pillars 318 and 320, respectively.

FIG. 3C illustrates the relationship between the diameters of the elements (for example, the conductive line patterns 208 and 210, the segments 202c and 202d and the vent holes 228, 230 and 232) of a circuit substrate 500c and the diameters of the conductive pillars 308, 310, 318 and 320 of the chip 300b in the semiconductor package 600b in accordance with one embodiment of the disclosure. In one embodiment, the segment 202c (or 202d), which is directly disposed on the through via plug 204, and the conductive line pattern 208 (or 210) adjacent thereto are extended substantially along the first direction 320, and separated from each other substantially along the second direction 322 perpendicular to the first direction 320. The relationship between the width of the segment 202c (or 202d), which is directly disposed on the through via plug 204, and the width of the conductive line pattern 208 (or 210) satisfies the Equation (1):

$$B \leq D1, \text{ and } B \leq W \qquad \text{Equation (1)}$$

wherein B is the width of the segment 202c (or 202d) and the conductive line pattern 208 (or 210) along the second direction 322, D1 is the diameter of the through via plug 204, and W is the width of the vent holes 228 (or 230) along the second direction 322.

In other embodiments, if the position of the conductive line pattern 208 (or 210), which is adjacent to the segment 202c (or 202d), is shifted, for example, if an extension line H1' passing through centers of the segment 202c (or 202d) and the conductive line pattern 208 (or 210) is not parallel to the second direction 322, the angle θ between the first extension line H1 along the second direction 322 and passing through the first center point C1 of the segment 202c (or 202d) and a second extension line H1' passing through the first center point C1 and the second center point C2 of the conductive line pattern 208 (or 210) satisfy the Equation (2):

$$0° \leq \theta \leq 45° \qquad \text{Equation (2)}$$

In one embodiment as shown in FIG. 3C, because the first extension line H1 overlaps the second extension line H1', the angle θ is equal to zero degrees.

In one embodiment, the minimum pitch P3 between the first center point C1 of the segment 202c (or 202d) and the second center point C2 of the conductive line pattern 208 (or 210) along the second direction 322 satisfies the Equation (3):

$$P3 = (B+U)\sec\theta, \text{ and } \theta=0° \qquad \text{Equation (3)}$$

wherein B is the width of the segment 202c (or 202d) and the width of the conductive line pattern 208 (or 210) along the second direction 322, and U is the width of the conductive pillars 318, 320, 308 and 310 along the second direction 322.

Additionally, in one embodiment, an angle λ between a first extension line V1 passing through the first center point C1 of the segment 202c (or 202d), which is directly disposed on the through via plug 204, along the first direction 320 and a second extension line V2 passing through the second center point C2 of the conductive line pattern 208 (or 210) satisfies the Equation (4):

$$0° \leq \lambda \leq 90° \qquad \text{Equation (4)}$$

In one embodiment as shown in FIG. 3C, because the first extension line V1 is substantially parallel to the second extension line V2, the angle λ is equal to zero degrees.

The circuit substrates 500a-500c as shown in FIGS. 1A-1C, 2A-2D and 3A-3D can be designed to dispose the conductive line patterns (or the segments of the conductive planar layer) directly on the through via plug, which is used to transmit power/ground (GND) voltage supplies. The conductive line pattern or the segments of the conductive planar layer may be used to bond the conductive pillar of the chip using the bump-on-trace (BOT) technology. The conductive line pattern or the segments of the conductive planar layer and the through via plug are formed of the same materials, so that their widths and spaces may be designed to conform with the design rule of the conductive line pattern adjacent thereto, and thus the routing density and the bump density of the circuit substrate may be increased. Additionally, the conductive line patterns, which include one or more being directly disposed on the through via plug, and the segments of the conductive planar layer may be used to transmit the same voltage supplies (such as power voltage supplies and ground (GND) voltage supplies) to the through via plug. It should be noted that those to be transmitted are limited to power voltage supplies and ground (GND) voltage supplies. The reason is that the conductive lines used to transmit the digital signals would be disposed in different positions according to different requirements due to the variety of the digital signals. It is difficult to dispose the conductive lines used to transmit the digital signals of the same type within the same region.

Figure 4A:
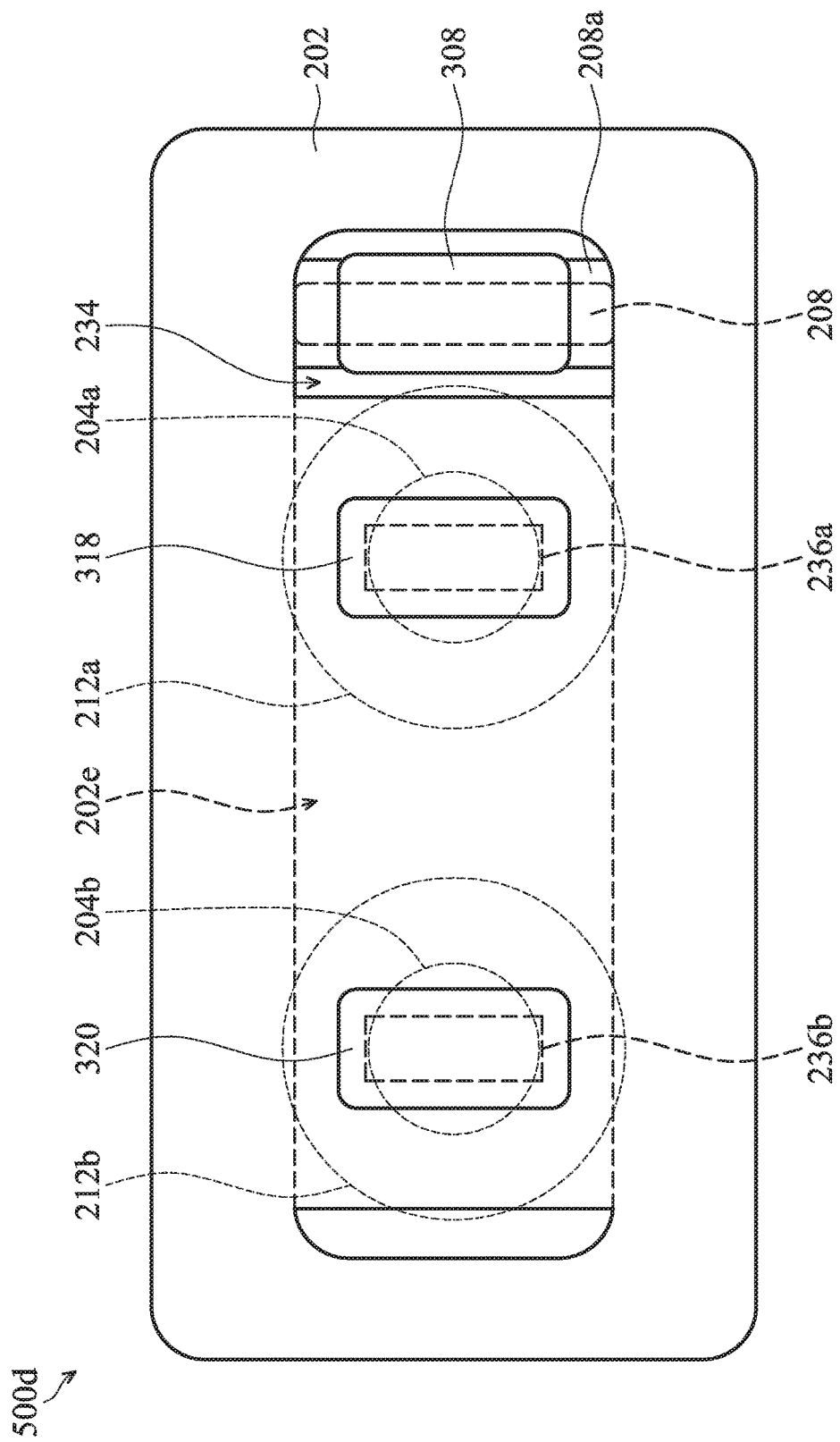
FIG. 4A is a plan view of a circuit substrate in accordance with still another embodiment of the disclosure.
Figure 4B:
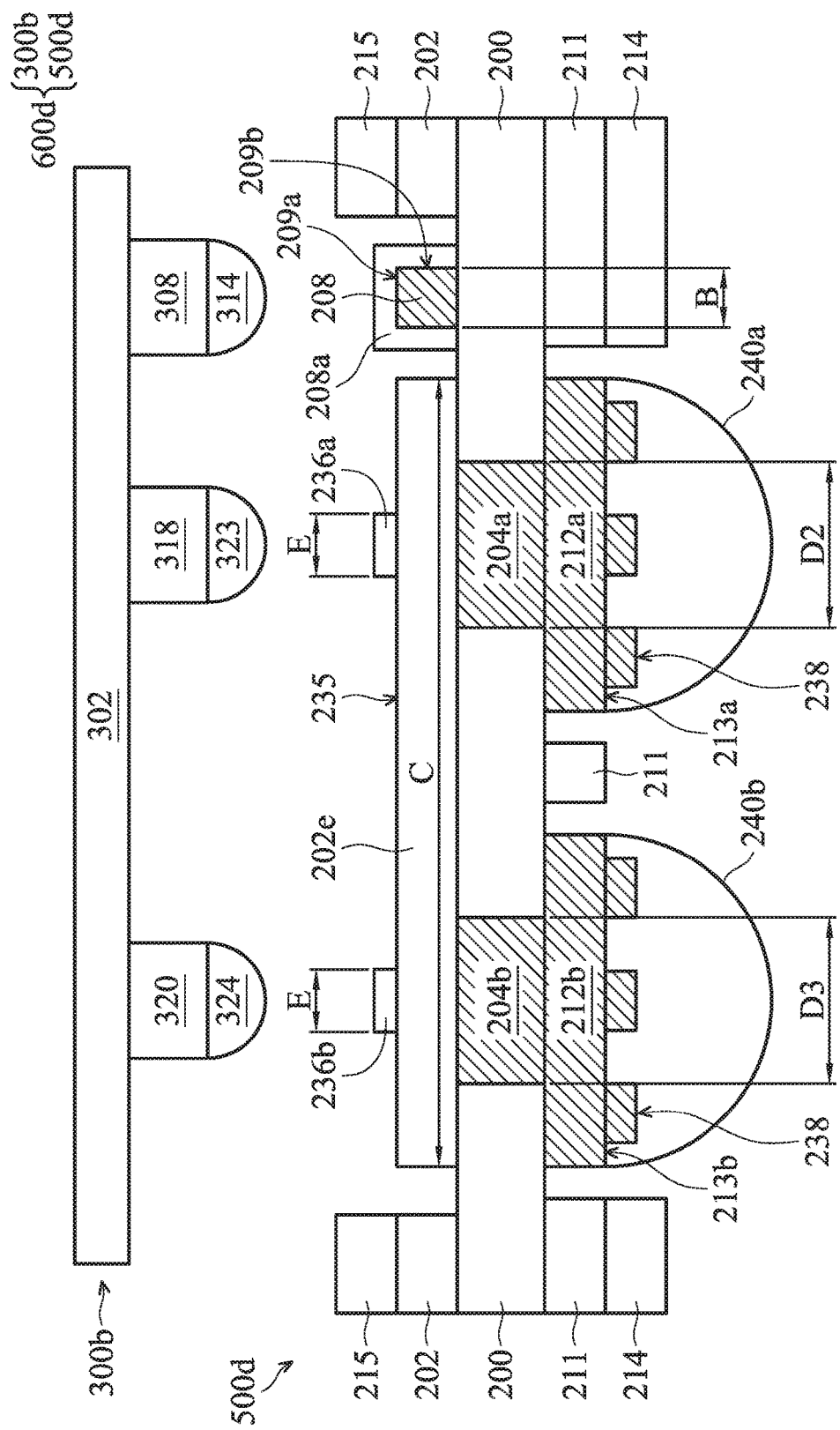
FIG. 4B is a cross-sectional view of a circuit substrate in accordance with still another embodiment of the disclosure.

FIG. 4A is a plan view of a circuit substrate 500d of a semiconductor package 600d in accordance with one embodiment of the disclosure. FIG. 4B is a cross-sectional view of FIG. 4A. FIG. 4B may serve as a cross-sectional view along the direction (the second direction 322) of the width of the BOT conductive line pattern (for example, a conductive planar layer 202e), which is in direct contact with the through via plug. FIG. 4A shows the conductive pillars of the chip but does not show the substrate and solder bumps for conveniently illustrating the arrangement of the circuit substrate. Elements of the embodiments hereinafter, that are the same or similar as those previously described with reference to FIGS. 1A-1C, 2A-2D and 3A-3C, are not repeated for brevity.

In one embodiment as shown in FIGS. 4A and 4B, any two (or more) of the conductive line patterns, which are adjacent to each other and are used to transmit the same voltage supply (such as power voltage supply or ground (GND) voltage supply), disposed on the chip-side surface can be merged as a single conductive planar layer having a larger area, in which the two adjacent conductive line patterns are in direct contact with and overlapping the through via plug. The width of the conductive planar layer is much larger than the sum of the widths of the two adjacent conductive line patterns. Moreover, two or more thickness enhancing conductive patterns may be disposed on a surface of the conductive planar layer, which is away from the chip-side surface. Positions of the thickness enhancing conductive patterns are disposed corresponding to the positions of the corresponding through via plugs of the circuit substrate. Because the total thickness of the conductive planar layer and the thickness enhancing conductive patterns is larger than that of the conductive line patterns (the bonding segments), the bonding area between the chip and the solder bump can be increased, and the bonding strength is also improved. When the substrate is a multi-layer circuit substrate, conductive pillars with various sizes can be disposed between different layers. The conductive pillars with small size can help to increase the BOT design density, the conductive pillar density and the space usage.

As shown in FIGS. 4A and 4B, the circuit substrate 500d comprises adjacent through via plugs 204a and 204b formed through the core substrate 200. Two terminals of each of the through via plugs 204a and 204b are aligned with the chip-side surface 201 and the bump-side surface 203 of the core substrate 200, respectively. In one embodiment, the through via plugs 204a and 204b are used to transmit the same type of voltage supply (the through via plugs 204a and 204b are both used to transmit power voltage supply or ground (GND) voltage supply).

A conductive planar layer 202e is formed on the chip-side surface 201. The conductive planar layer 202e is in direct contact with and overlapping the through via plugs 204a and 204b. Also, the conductive planar layer 202e is separated from the conductive line pattern 208. In one embodiment, the conductive planar layer 202e, the conductive line pattern 208 and the conductive planar layer 202 belong to the same layered-level. Therefore, the conductive planar layer 202e, the conductive line pattern 208 and the conductive planar layer 202e have the same thickness. It should be noted that the width C of the conductive planar layer 202e is much larger than the width B of the conductive line pattern 208, even larger than twice the width B of the conductive line pattern 206, which is disposed directly on the through via plugs 204 of the circuit substrates 500a and 500b (FIGS. 1A-1C and 2A-2D). The conductive planar layer 202 connects to and electrically contacts the conductive planar layer 202e and the conductive line pattern 208. That is to say, the conductive planar layer 202e is electrically connected to the conductive line pattern 208 through the conductive planar layer 202. In other embodiments, the conductive planar layer 202e may be a segment of the conductive planar layer 202. As shown in FIG. 4A, the conductive planar layer 202e, the conductive line pattern 208 and the conductive planar layer 202 collectively form a vent hole 234 on the chip-side surface 201. In one embodiment, the shape of the vent hole 234 may include a rectangular shape, a polygonal shape or an elliptical shape.

In one embodiment, the circuit substrate 500d further comprises thickness enhancing conductive patterns 208a, 236a and 236b. The thickness enhancing conductive pattern 208a is disposed on the conductive line pattern 208. The thickness enhancing conductive pattern 208a covers a top surface 209a, which is away from the chip-side surface 201, and two side surfaces 209b of the conductive line pattern 208. Therefore, the total width of the thickness enhancing conductive pattern 208a and the conductive line pattern 208 is greater than the width B of the conductive line pattern 208. The thickness enhancing conductive patterns 236a and 236b are disposed on a surface 235 of the conductive planar layer 202e, which is away from the chip-side surface 201. The thickness enhancing conductive patterns 236a and 236b are positioned corresponding to positions of the conductive pillars 318 and 320 of the chip 300b. In one embodiment, the width E of the thickness enhancing conductive patterns 236a and 236b may be less than the width C of the conductive planar layer 202e. Also, the width E can be equal to the total width of the thickness enhancing conductive pattern 208a and the conductive line pattern 208. In one embodiment, the shape of the thickness enhancing conductive patterns 236a and 236b disposed on the conductive planar layer 202e may include a rectangular shape, a square shape, an elliptical shape, a triangle shape or a polygonal shape. Because top-view areas of the thickness enhancing conductive patterns 236a and 236b are respectively less than a top-view area of the thickness enhancing conductive pattern 208a (FIG. 4A), and top surfaces and sidewalls of the thickness enhancing conductive patterns 236a and 236b are positioned above the conductive planar layer 202e, the thickness enhancing conductive patterns 236a and 236b may increase the bonding area between the circuit substrate 500d and the corresponding solder bumps 323 and 324 corresponding to the chip 300b. Also, the thickness enhancing conductive patterns 236a and 236b may increase the bonding strength between the chip 300b and the circuit substrate 500d.

In the circuit substrates 500a-500d as shown in FIGS. 1B, 2B, 3B and 4B, the thickness enhancing conductive patterns may be disposed on a surface of the pad, which is away from the bump-side surface. The thickness enhancing conductive patterns can help to increase the bonding area and the bonding strength between the solder bumps and the pads.

As shown in FIGS. 1B, 2B, 3B and 4B, the circuit substrates 500a-500d may comprise one or more thickness enhancing conductive patterns 238 disposed on surfaces 213, 213a and 213b of pad 212, 212a and 212b, which is away from the bump-side surface 203. The solder bumps 240, 240a and 240b are disposed on the surfaces 213, 213a and 213b of pad 212, 212a and 212b, encapsulating the thickness enhancing conductive patterns 238.

FIGS. 5A-5F are plan views of thickness enhancing conductive patterns 238a-238f disposed on the pad 212 (including the pads 212a and 212b) of circuit substrates 500a-500d in accordance with some embodiments of the disclosure. In one embodiment as shown in FIGS. 5A-5F, each of the thickness enhancing conductive patterns 238a-238f is a single thickness enhancing conductive pattern. In one embodiment, each of the thickness enhancing conductive patterns 238a-238f may have a plurality of protruding portions. Also, the protruding portions have rotational symmetry with one another about a rotation axis passing through the center of the thickness enhancing conductive pattern. An angle α between two of the adjacent protruding portions is greater than 90 degrees. When the solder bump is bonded on the pad having the thickness enhancing conductive pattern, the thickness enhancing conductive pattern is enclosed by the solder of the solder bump from sidewalls to the top of the thickness enhancing conductive pattern. Because the angle α between two of the adjacent protruding portions is greater than 90 degrees, the solder may fully enclose the thickness enhancing conductive pattern along the sidewall of the protruding portions without generating any voids. Therefore, the thickness enhancing conductive pattern may be used to increase the bonding area between the solder bumps and the pads. When the density of the pads is required to be increased and the space between the pads is required to be decreased, the bonding strength will be insufficient if the area of the pads is decreased. In addition, the routing space will be limited if the area of the pads cannot be decreased. The design method of the thickness enhancing conductive pattern may balance the requirements of the bonding strength and the routing space. Also, the design method of the thickness enhancing conductive pattern improves the bonding strength.

Figure 5A:
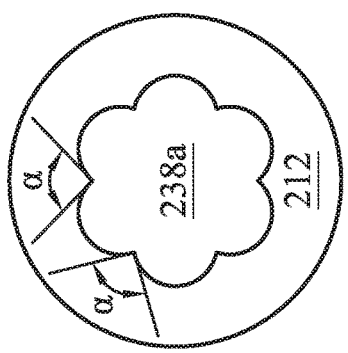
FIGS. 5A-5F are plan views of thickness enhancing conductive patterns on pads of circuit substrates in accordance with some embodiments of the disclosure.
Figure 5B:
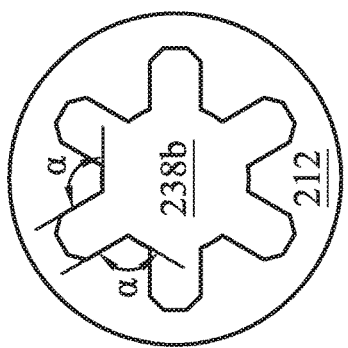
Figure 5C:
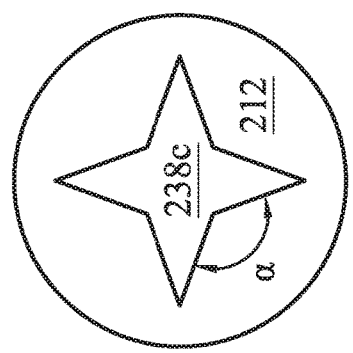
Figure 5D:
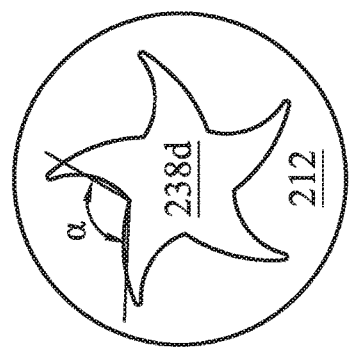
Figure 5E:
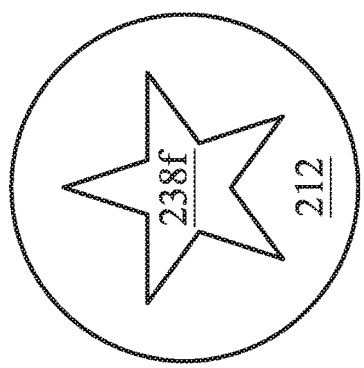
Figure 5F:
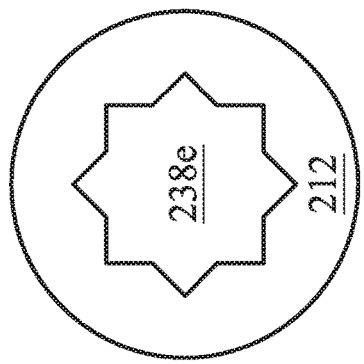
Figure 5G:
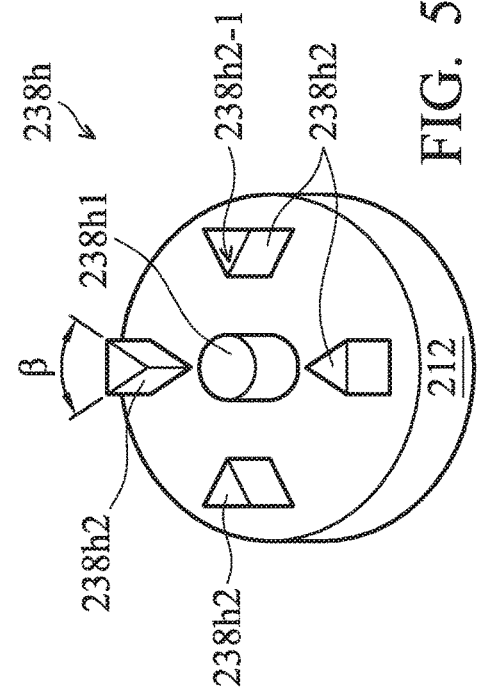
FIGS. 5G-5M are three-dimensional views of thickness enhancing conductive patterns on pads of circuit substrates in accordance with some embodiments of the disclosure.
Figure 5H:
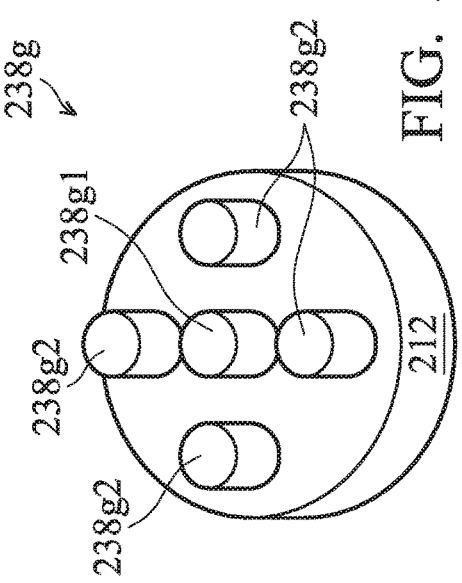
Figure 5J:
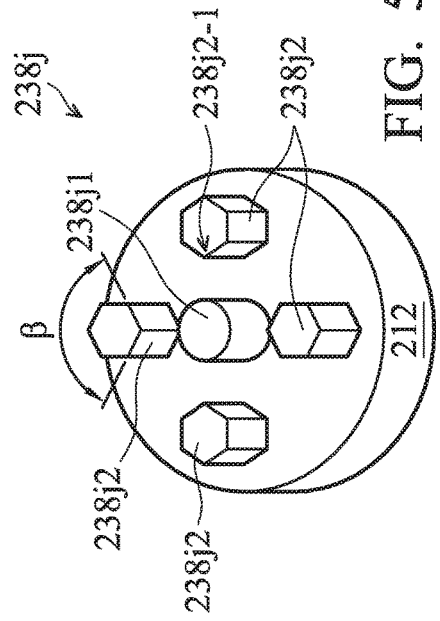
Figure 5L:
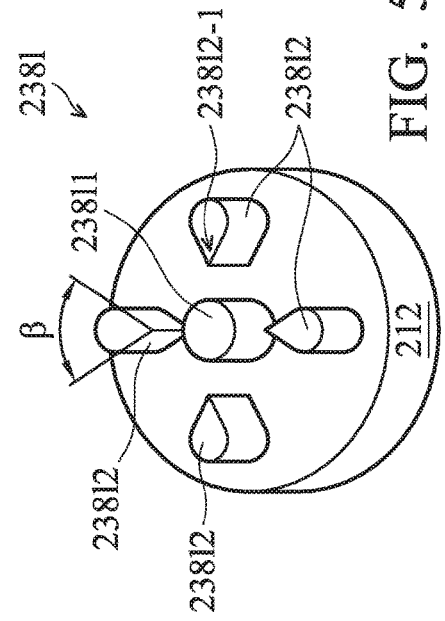
Figure 5I:
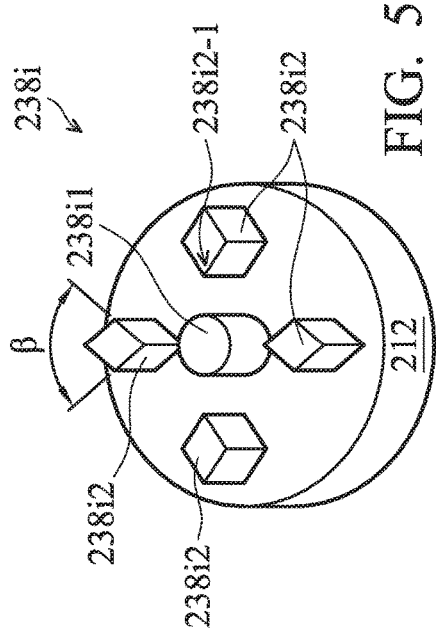
Figure 5K:
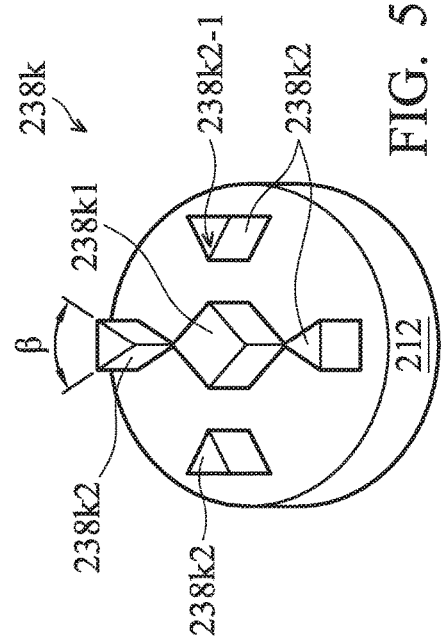
Figure 5M:
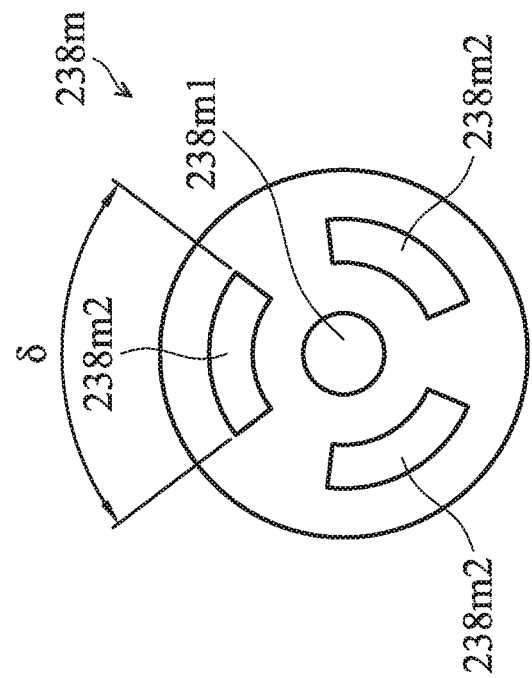

FIGS. 5G-5M are three-dimensional (3D) views of thickness enhancing conductive patterns 238g-238m on the pad 212 (or the pads 212a and 212b) of circuit substrates 500d-500d in accordance with some embodiments of the disclosure. In some embodiments as shown in FIGS. 5G-5L, the thickness enhancing conductive pattern 238g/238h/238i/238j/238k/238l each comprises one center pillar 238g1/238h1/238i1/238j1/238k1/238l1 and at least four peripheral pillars 238g2/238h2/238i2/238j2/238k2/238l2. In some embodiments as shown in FIG. 5M, the thickness enhancing conductive pattern 238m comprises one center pillar 238m1 and three peripheral pillars 238m2. In each of the thickness enhancing conductive patterns, the center pillar is surrounded by the peripheral pillars. The peripheral pillars are separated from the center pillar by a distance, respectively. In one embodiment, the center pillar may comprise a circular pillar, a triangular pillar, a four corner pillar or a polygonal pillar. Also, the peripheral pillars 238g2/238h2/238i2/238j2/238k2/238l2 may comprise circular pillars, triangular pillars, four corner pillars or polygonal pillars. In some embodiments as shown in FIGS. 5H-5L, each of the peripheral pillars 238g2/238h2/238i2/238j2/238k2/238l2 has one corner portion 238g2-1/238h2-1/238i2-1/238j2-1/238k2-1/238l2-1 close to the center pillar 238g1/238h1/238i1/238j1/238k1/238l1, respectively. An angle β of the corner portion 238g2-1/238h2-1/238i2-1/238j2-1/238k2-1/238l2-1 is designed to be less than 90 degrees. In some embodiments as shown in FIG. 5M, a pair of extension lines (as shown in solid lines) along a pair of opposite sides of the peripheral pillar 238m2 crosses at a center of the center pillar 238m1. An angle δ of the pair of extension lines is less than 90 degrees. When the solder bump is formed on the pad having the thickness enhancing conductive pattern, the solder of the solder bump encloses the peripheral pillars and the center pillar from the sidewalls of the peripheral pillars to tops of the peripheral pillars and the center pillar. Because the angle β of the corner portions of the peripheral pillars is designed to be less than 90 degrees, or the angle δ of the pair of extension lines along a pair of opposite sides of the peripheral pillar crossing at a center of the center pillar is designed to be less than 90 degrees, the solder may fully enclose the peripheral pillars and the center pillar along the sidewalls of the peripheral pillars without generating any voids. Therefore, the thickness enhancing conductive pattern may be used to increase the bonding area between the solder bumps and the pads. Also, the thickness enhancing conductive pattern improves the bonding strength.

Embodiments provide a circuit substrate for a chip bonding thereon using the flip-chip bonding technology. The circuit substrate in accordance with embodiments of the disclosure includes disposing the conductive line patterns or the segments of the conductive planar layer, which are serving as the bonding segments of the conductive lines, directly on the through via plugs, which are used to transmit power/ground (GND) voltage supplies. The conductive line patterns or the segments of the conductive planar layer may be bonded to the conductive pillars of the chip using the bump-on-trace (BOT) technology. The conductive line patterns or the conductive planar layer and the through via plug may be formed of the same materials, and their width and space may be designed to conform to the design rule of the adjacent conductive lines. Accordingly, the routing density and the bump density of the circuit substrate are increased. Also, the signal integrity of the power/ground (GND) voltage supplies transmitted by the circuit substrate is improved. Additionally, the conductive line patterns respectively disposed on the two adjacent through via plugs can be merged as a single conductive planar layer. One or more thickness enhancing conductive patterns may be disposed on the pad, which connects to the through via plug, to increase the bonding strength between the pad of the circuit substrate and the solder bumps.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit substrate for a chip bonding thereon, comprising:
    a core substrate having a chip-side surface and a bump-side surface opposite to the chip-side surface;
    a first through via plug passing through the core substrate;
    a pad disposed on the bump-side surface, in contact with the first through via plug;
    a first thickness enhancing conductive pattern disposed on a surface of the pad, which is away from the bump-side surface, wherein a furthermost surface away from the bump-side surface and sidewalls of the first thickness enhancing conductive pattern are entirely covered by a solder bump which is disposed on the surface of the pad, and the first thickness enhancing conductive pattern and the solder bump are disposed at the same side of the surface of the pad;
    a second through via plug passing through the core substrate; and
    a single conductive planar layer disposed on the chip-side surface, wherein the single conductive planar layer is in direct contact with and overlapping the first and second through via plugs and the first and second through via plugs are used to transmit the same type of voltage supply.

2. The circuit substrate as claimed in claim 1, wherein the first thickness enhancing conductive pattern has a plurality of protruding portions, and the protruding portions have rotational symmetry with one another about a rotation axis passing through a center of the first thickness enhancing conductive pattern.

3. The circuit substrate as claimed in claim 2, wherein an angle between two of the adjacent protruding portions is greater than 90 degrees.

4. The circuit substrate as claimed in claim 1, wherein the first thickness enhancing conductive pattern comprises a center pillar and at least three peripheral pillars separated from the center pillar by a distance, respectively.

5. The circuit substrate as claimed in claim 4, wherein a corner portion of the peripheral pillars is close to the center pillar, and an angle of the corner portion is less than 90 degrees.

6. The circuit substrate as claimed in claim 4, wherein a pair of extension lines along a pair of opposite sides of one of the peripheral pillars crosses at a center of the center pillar, and an angle of the pair of extension lines is less than 90 degrees.

7. The circuit substrate as claimed in claim 1, further comprising:
   a second thickness enhancing conductive pattern disposed on a surface of the conductive planar layer, which is away from the chip-side surface.

8. The circuit substrate as claimed in claim 7, wherein a width of the second thickness enhancing conductive pattern is less than a width of the conductive planar layer.

9. The circuit substrate as claimed in claim 7, further comprising a conductive line pattern disposed on the chip-side surface, wherein the first through via plug and the second through via plug do not contact with the conductive line pattern.

* * * * *